(12) United States Patent
Hanina et al.

(10) Patent No.: US 7,508,515 B2
(45) Date of Patent: Mar. 24, 2009

(54) SYSTEM AND METHOD FOR MANUFACTURING PRINTED CIRCUIT BOARDS EMPLOYING NON-UNIFORMLY MODIFIED IMAGES

(75) Inventors: Golan Hanina, Rishon Lezion (IL); Hanan Gino, Rishon Lezion (IL); Steffen Ruecker, Groslobichau (DE); Ido Ben-Tov, Herut (IL)

(73) Assignee: Orbotech Ltd, Yavne (IL)

( * ) Notice: Subject to any disclaimer, the term of this patent is extended or adjusted under 35 U.S.C. 154(b) by 420 days.

(21) Appl. No.: 10/513,058

(22) PCT Filed: May 1, 2003

(86) PCT No.: PCT/IL03/00356

§ 371 (c)(1), (2), (4) Date: May 19, 2005

(87) PCT Pub. No.: WO03/094582

PCT Pub. Date: Nov. 13, 2003

(65) Prior Publication Data

US 2005/0213806 A1    Sep. 29, 2005

Related U.S. Application Data

(60) Provisional application No. 60/376,874, filed on May 2, 2002.

(51) Int. Cl.
- G01B 11/00 (2006.01)
- G06K 9/00 (2006.01)
- B41J 2/47 (2006.01)
- B41J 2/435 (2006.01)
- G03F 9/00 (2006.01)
- G03C 5/00 (2006.01)

(52) U.S. Cl. .................. 356/401; 382/151; 347/234; 347/248; 430/22; 430/30

(58) Field of Classification Search .................. None
See application file for complete search history.

(56) References Cited

U.S. PATENT DOCUMENTS

| | | | |
|---|---|---|---|
| 4,835,704 A | | 5/1989 | Eichelberger et al. |
| 5,162,240 A | | 11/1992 | Saitou et al. |
| 5,649,022 A | * | 7/1997 | Maeda et al. ............... 382/141 |
| 5,980,088 A | | 11/1999 | Iwasaki et al. |
| 6,100,915 A | * | 8/2000 | Iwasaki et al. ............... 347/249 |
| 6,118,517 A | * | 9/2000 | Sasaki et al. .................. 355/53 |
| 6,165,658 A | * | 12/2000 | Taff et al. ..................... 430/30 |
| 6,239,858 B1 | * | 5/2001 | Tomimatu .................... 355/18 |
| 6,567,713 B2 | | 5/2003 | Lichtenstein et al. |

(Continued)

FOREIGN PATENT DOCUMENTS

JP    3019395 A    1/1991

(Continued)

Primary Examiner—Gregory J Toatley, Jr.
Assistant Examiner—Gordon J Stock, Jr.
(74) Attorney, Agent, or Firm—Sughrue Mion, PLLC

(57) ABSTRACT

A system and method for fabricating an electrical circuit in which a digital control image (46) is generated by non-uniformly modifying (44) a representation of an electrical circuit (40), such that an electrical circuit pattern (72) recorded on a substrate (12) using the digital control image (46) precisely fits an already formed electrical circuit portion (62).

17 Claims, 19 Drawing Sheets

U.S. PATENT DOCUMENTS

| | | | |
|---|---|---|---|
| 6,581,202 B1 * | 6/2003 | Tourne et al. | 716/20 |
| 6,701,197 B2 | 3/2004 | Ben-Ezra et al. | |
| 6,770,866 B2 | 8/2004 | Retschke et al. | |
| 6,879,789 B2 * | 4/2005 | Yamada et al. | 399/106 |
| 6,911,620 B2 * | 6/2005 | Lipman et al. | 219/121.68 |
| 2001/0010536 A1 | 8/2001 | Katzir et al. | |
| 2002/0122109 A1 * | 9/2002 | Ehsani et al. | 347/240 |
| 2003/0190071 A1 | 10/2003 | Ganot et al. | |

FOREIGN PATENT DOCUMENTS

| | | |
|---|---|---|
| JP | 4260393 A | 9/1992 |
| JP | 5138420 A | 6/1993 |
| JP | 7231175 A | 8/1995 |
| JP | 9323180 A | 12/1997 |
| JP | 10150279 A | 6/1998 |
| JP | 2000099736 A | 4/2000 |
| WO | WO 00/02424 | 1/2000 |
| WO | WO 02/039794 | 5/2002 |

* cited by examiner

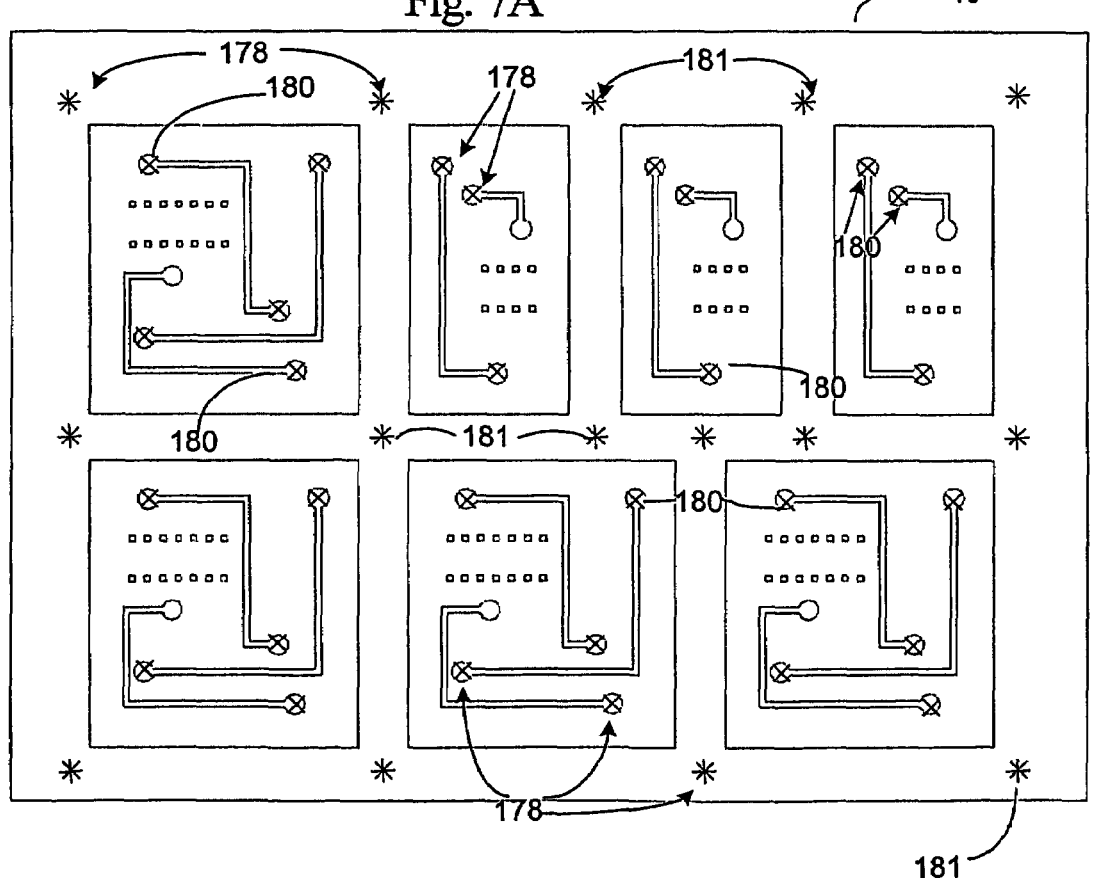

SYSTEM AND METHOD FOR MANUFACTURING PRINTED CIRCUIT BOARDS EMPLOYING NON-UNIFORMLY MODIFIED IMAGES

CROSS-REFERENCE TO RELATED APPLICATIONS.

This application is a PCT application claiming priority from U.S. Provisional Application No. 60/376,874, filed May 2, 2002, which is incorporated by reference, herein, in its entirety.

FIELD OF THE INVENTION.

The following invention generally relates to printed circuit board manufacture, and more particularly to systems and methods that precisely record electrical circuit pattern portions on substrates.

BACKGROUND OF THE INVENTION.

A laser direct imaging (LDI) system suitable for recording electrical circuit pattern portions on photosensitive layers of electrical circuit substrates is commercially available from Orbotech Ltd. of Yavne Israel under the name DP-100™.

Among the problems which arise during the manufacture of multi-layered printed circuit boards is that an electrical circuit pattern portion that is recorded on a substrate layer needs to have precise dimensions and needs to be precisely aligned on the substrate layer so that it can be readily combined with electrical circuit pattern portions formed on other substrate layers. The following copending U.S. patent applications describe various systems and methodologies that may be helpful in ensuring that electrical circuit pattern portions recorded on printed circuit board substrates have requisite dimensions and alignment: Ser. Nos. 09/708,160, 09/792,498 and 10/045,651. These are incorporated by reference for their useful background teachings in this regard.

In the manufacture of multi-layered printed circuit boards, a plurality of independent electrical circuit pattern portions are formed on an electrical circuit substrate. Typically, each of the independent pattern portions will be incorporated into a different electrical circuit device. According to one method of printed circuit board manufacture, several substrate layers, each containing an appropriate arrangement of electrical circuit portions, are combined to form a printed circuit board. According to another method of printed circuit board manufacture, several layers of an electrical circuit are built up in sequential layer formation steps on the same electrical circuit substrate core.

During manufacture, process errors and handling can result, inter alia, in a change of dimension, change of shape or change in location, relative to an absolute dimension, shape or location, of the electrical circuit substrate. Such changes may affect one or more electrical circuit portions already formed on the substrate, thus requiring suitable adaptation of subsequently formed electrical circuit portions.

SUMMARY OF THE INVENTION

The present invention seeks to provide pattern recording systems, and methodologies employed in such systems, for recording non-uniformly modified electrical circuit pattern portions on an electrical circuit substrate. A non-uniformly modified electrical circuit pattern portion may include a portion of a pattern that is used in a single electrical circuit. Alternatively, non-uniformly modified electrical circuit pattern portions may include portions of patterns that, although formed on the same substrate, are used in several independent electrical circuits.

The present invention further seeks to provide pattern recording systems, and methodologies employed in such systems, for recording electrical circuit patterns whose dimensions and/or shape are suitably modified in a non-uniform manner respective of a given input so as to correspond to a previously recorded electrical circuit pattern.

The present invention still further seeks to provide pattern recording systems, and methodologies employed in such systems, operative to non-uniformly modify patterns such that recorded patterns are suitably dimensioned, aligned and/or positioned respective of previously formed corresponding electrical circuit portions.

The present invention still further seeks to provide each of the above functionalities in a direct imaging system employing a scanner.

In accordance with a broad aspect of the invention, image recording systems for recording non-uniformly modified versions of electrical circuit patterns are, for example, direct imaging systems. Such systems may employ for example coherent light, provided for example by lasers, or alternatively non-coherent light, provided for example by LEDs.

In accordance with a broad aspect of the invention, a non-uniformly modified version of a computerized image of a pattern is recorded on a substrate. One way to do this is, for example, by scanning a modulated beam of light across a surface.

In accordance with another broad aspect of the invention, an initial version of a computerized image of a pattern is supplied to a recording system, and the recording system non-uniformly modifies the initial version of the computerized image prior to recording a non-uniformly modified version of the pattern on a substrate.

In accordance with a broad aspect of an embodiment of the invention, a laser direct imaging system is operative to record a pattern on a photosensitized surface of an electrical circuit substrate such that a first electrical circuit pattern portion is aligned relative to first previously formed electrical circuit pattern portion, and a second electrical circuit pattern portion is aligned relative to a second previously formed electrical circuit pattern portion. The version of the pattern recorded on the photosensitized surface is non-uniformly modified such that at least part of the recorded pattern has an actual magnification, an actual shape, or actual location that is altered independently of other parts of the recorded pattern.

In accordance with another broad aspect of an embodiment of the invention, a substrate onto which a pattern is to be recorded includes a plurality of alignment targets. The respective locations of selected alignment targets are ascertained, for example, by optically sensing their locations. A representation of an electrical circuit pattern, used by an LDI system to expose a photosensitive substrate, is non-uniformly modified to fit fiduciaries in the representation of the electrical circuit to sensed locations of alignment targets.

In accordance with another broad aspect of the invention, the non-uniform modification of the representation of an electrical circuit pattern is by means of a non-linear transform.

The operation of non-uniform modification of a representation of an electrical circuit may be carried out globally; that is to say, modification of the representation is calculated with reference to the actual locations of alignment targets that are distributed throughout substantially all portions of an electrical circuit substrate.

Alternatively, the step of non-uniform transformation of the representation is made on a sector by sector basis. In this alternative mode of operation, each sector corresponds, for example, to a separate electrical circuit portion to be formed on the electrical circuit substrate. Each electrical circuit portion to be formed is separately scaled, aligned and positioned relative to a previously deposited complimenting electrical circuit portion. Each of the sectors, if considered individually, may be uniformly scaled, aligned and positioned relative to a reference location, but because different scale, alignment and position factors are applied to different sectors, when all sectors of the pattern are considered together, then the pattern as a whole is non-uniformly modified. The calculation of a suitable global, or sector by sector, transformation function may be performed offline or in real time.

In accordance with another broad aspect of an embodiment of the invention, an LDI system is used to expose a given electrical circuit pattern in several repeated steps on a photosensitized substrate. A computer control file, operating the LDI system, is created in which the magnification, alignment or position of each repeated occurrence of the electrical circuit pattern is individually adjusted in response to an actual location of one or more alignment targets located in a previously formed electrical circuit pattern. Adjustment may include, for example, location, scaling or rotation.

Alternatively, a computer control file operating the LDI system is created. The computer control file contains multiple repeat occurrences of a given electrical circuit pattern. Each repeat occurrence of the given electrical circuit pattern in the control file corresponds to a repeat occurrence of the given electrical circuit paptete to be exposed on the substrate. The computer control file is non-uniformly modified so each repeat occurrence of the given electrical circuit pattern fits an actual location with reference to a set of alignment targets.

In accordance with still another broad aspect of an embodiment of the invention, an LDI system is used to expose a given electrical circuit pattern on a photosensitized substrate on a circuit by circuit basis. The respective locations of alignment targets are ascertained at a first location and the magnification, location and orientation of the given electrical circuit pattern is adjusted in response to the locations of the alignment targets. As needed, a stage holding the substrate, on which the electrical circuit pattern portion is to be formed, is rotated. This process is repeated for each repeat occurrence of the electrical circuit pattern portion.

In accordance with still another broad aspect of an embodiment of the invention, an LDI system is employed to non-uniformly modify a CAM image during exposure of a substrate, to generate a non-uniform version of the CAM image. A method to accomplish such non uniform modification of a CAM image employs a control file operative to modify a data clock synchronizing between the CAM image and a location on a substrate at which the CAM image is being recorded.

The invention is taught below by way of various specific exemplary embodiments explained in detail, and illustrated in the enclosed drawing figures.

BRIEF DESCRIPTION OF THE DRAWINGS

The drawing figures depict, in highly simplified schematic form, embodiments reflecting the principles of the invention. Many items and details that will be readily understood by one familiar with this field have been omitted so as to avoid obscuring the invention. In the drawings:

FIGS. 7A-7E are simplified schematic illustrations of computer files of electrical circuits useful in understanding the methodology of FIG. 6; e

DETAILED DESCRIPTION

The invention will now be taught using various exemplary embodiments. Although the embodiments are described in detail, it will be appreciated that the invention is not limited to just these embodiments, but has a scope that is significantly broader. The appended claims should be consulted to determine the true scope of the invention.

Figure 1:
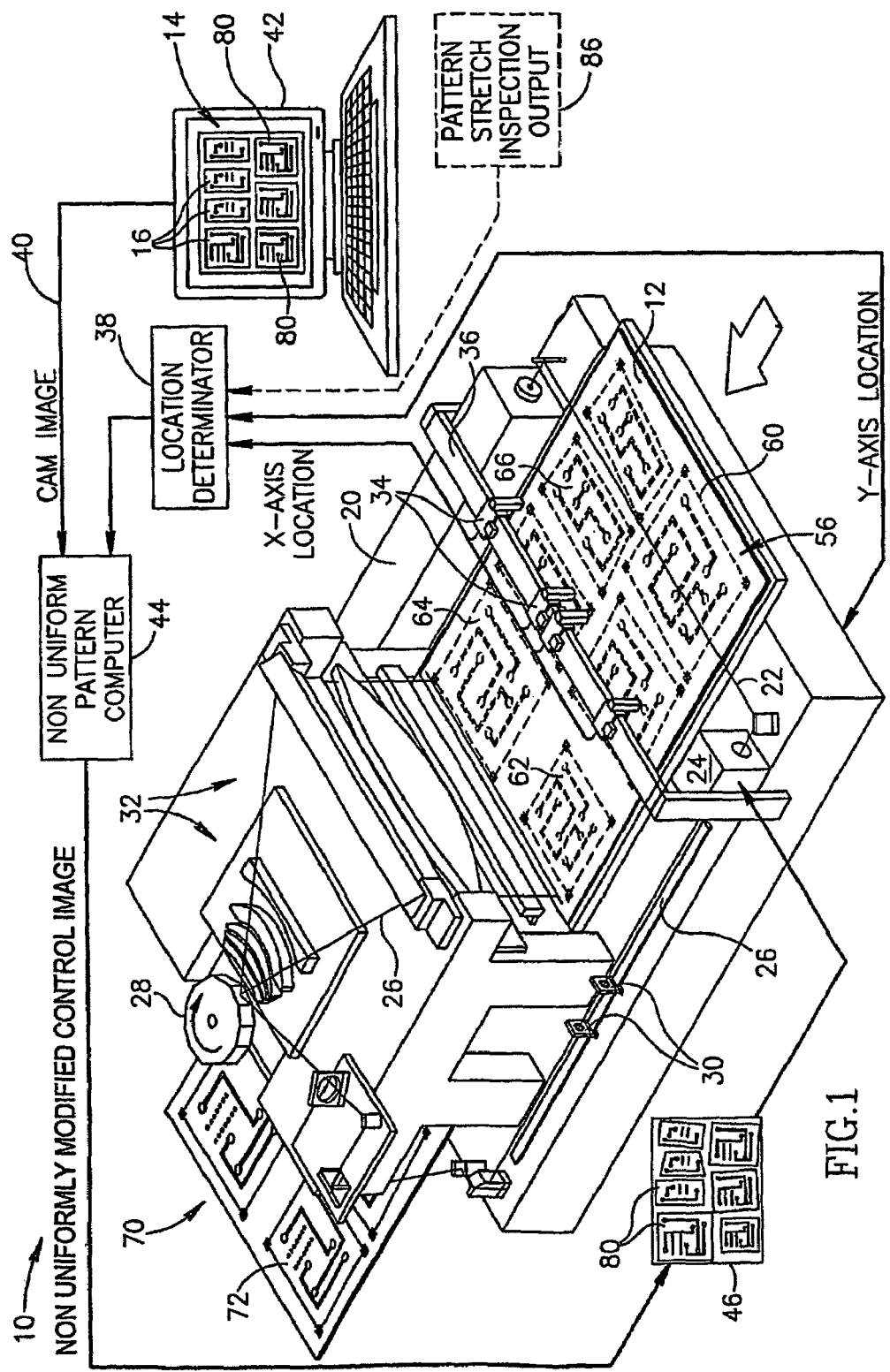
FIG. 1 is a simplified pictorial illustration of a system for exposing patterns on photosensitized surfaces of substrates in accordance with an embodiment of the invention.

Reference is made to FIG. 1, which is a simplified pictorial illustration of a system 10 for exposing patterns on photosensitized surfaces of substrates 12, such as electrical circuit substrates, in accordance with an embodiment of the invention. As used in the following description, reference to electrical circuits includes any suitable form of electrical circuits, including printed circuit boards, ball grid array substrates, multi-chip modules, integrated circuits, and the like. Reference a direct imaging system includes, for example, a laser direct Imaging (LDI) system or in the alternative any suitable direct imaging system, for example one that employs a spatial light modulator and scanner to scan a modulated beam of coherent or incoherent light. Reference to substrates includes reference to any suitable substrate on which a pattern can be recorded using a direct imaging system. Substrates include any suitable substrate that can be employed in the manufacture of electrical circuits.

In FIG. 1, system 10 is an LDI type direct imaging system operative to expose a photo-sensitive layer, such as a photoresist, deposited on a substrate 12 according to a pattern 14. System 10 is described herein in the context of an LDI system, although any suitable direct imaging system may be employed. Pattern 14 typically includes a plurality of pattern portions, generally designated by reference numeral 16. In the embodiment seen in FIG. 1, each of the pattern portions 16 corresponds to a portion of an electrical circuit that will be incorporated into a separate printed circuit board device (not shown). Typically, at least some of pattern portions 16, that are already formed on a substrate 12, or that are to be formed on a substrate 12, are generally identical, however this is not necessarily always the case.

LDI system 10 generally includes the following parts: a laser 20 generating a laser beam 22; a modulator 24 receiving and modulating laser beam 22 to form a data modulated laser beam 26; a scanner such as a rotating polygon 28, or other suitable scanning device such as an acousto-optical deflector or galvanometer, receiving data modulated laser beam 26 and scanning it along a scan axis across the surface of substrate 12; a displacement assembly (not shown) displacing substrate 12 along an axis, the cross scan axis, which is generally transverse to the scan axis; pre-scan optics 30 located between laser 20 and rotating polygon 28 operative to suitably shape data modulated laser beam 26 for scanning by rotating polygon 28; and post-scan optics 32 located between rotating polygon 28 and substrate 12 operative, inter alia, to suitably shape data modulated laser beam 26 for recording an image on the surface of substrate 12, which typically is photosensitized, such as with a photoresist. System 10 additionally includes assemblies (not shown) for determining the generally instantaneous location of modulated laser beam 26 along the scan axis, as well as the position of substrate along the cross scan axis. A suitable system including an assembly for determining the location of modulated laser beam 26 along the scan axis is described in copending U.S. patent application Ser. No. 10/038,061, the disclosure of which is incorporated by reference in its entirety for this purpose.

In accordance with an embodiment of the invention, system 10 includes additional assemblies, including for example sensors 34, mounted on a bridge 36, whose outputs are used in combination with the outputs of various encoders (not shown) by a location determinator 38 to determine the actual location and orientation of substrate 12 in a coordinate system used by system 10 for recording pattern 14 on substrate 12. Although shown as being an integral part of system 10, it is appreciated that sensors 34 and location determinator 38 may be included as part of a stand-alone X-Y measuring system in operational communication with system 10.

Optionally, the outputs of sensors 34 and encoders are additionally used by location determinator 38 to determine the actual location of various portions 16, such as electrical circuit portions 56, already formed on substrate 12, as described hereinbelow in greater detail. The structure and operation of suitable assemblies useful in determining the location and orientation of substrate 12 are described in greater detail in the following copending U.S. patent applications, the disclosures of which are incorporated herein by reference in their entirety for this kind of structure and operation: Ser. Nos. 09/581,377, 09/708,160, 09/792,498 and 10/045,651.

In accordance with an embodiment of the invention, the initial source of data for modulating laser beam 22 at modulator 24 to record a pattern 14 onto the surface of substrate 12 is a CAM image 40 employed by a CAM system 42. CAM image 40 may be any suitable computer file, and in an embodiment of the invention is, for example, a raster image defined, for example, by a two-dimensional array of a multiplicity of pixels. It is appreciated that because of the large quantity of information contained in a typical CAM image 40 of an electrical circuit pattern, the CAM image 40 may be provided in a compressed format, for example by representing sequences of like pixels in a line as a vector. In the CAM image 40 each of the pixels corresponds to a location on the surface of substrate 12 and indicates whether laser energy from modulated laser beam 26 is to be delivered, or not delivered, at such location.

It is noted that system 10 described hereinabove is highly a simplified schematic illustration helpful for understanding the invention. A suitable direct imaging system for use as system 10 is the DP-100™ LDI system available from Orbotech Ltd. of Yavne, Israel. Various additional structural and operational details of the DP-100™ LDI system are described in copending U.S. patent application Ser. Nos. 09/581,377, 09/735,872, 09/708,160, 09/792,498, 10/038, 061 and 10/045,651, the disclosures of which are incorporated herein by reference in their entirety for this purpose.

In the art of electrical circuit manufacture it is a common practice to fabricate an electrical circuit from several substrate layers such that each layer contains a portion of a complete electrical circuit. The respective layers may be formed separately and then combined. Alternatively, they may be formed in a sequential build up manner by sequentially forming subsequent layers of an electrical circuit on the same electrical circuit core. Consequently, it is desirable to record a pattern 14 on the surface of a substrate 12 such that electrical circuit portions corresponding to pattern portions 16 can be readily fit together with complementing already formed electrical circuit portions.

In actuality the dimensions, location or even the shape of an electrical circuit portion already formed on a substrate 12, may differ compared to an absolute dimension, location and shape, such as may be indicated in CAM image 40. The affects of such differences on electrical circuit manufacture processes often are compounded because each of the various substrate layers typically contains a plurality of electrical circuit portions. Each of the electrical circuit portions on a substrate layer is to be combined into a different printed circuit board. Moreover, each printed circuit board device that is fabricated from a completed substrate, whether formed by several discrete layers or by sequential build up, typically includes several layers that are each formed separately from other layers. Finally, several printed circuit boards typically are fabricated from the same set of substrate layers.

As previously noted, in some electrical circuit fabrication processes, electrical circuit pattern portions are formed on separate layers of a substrate, and then the separate layers of substrate are combined together to form a printed circuit board. Alternatively, at least some of the electrical circuit layers are built up, sequentially in a sequential build up manner, directly over existing electrical circuit portions already formed on a substrate core.

It is a feature of an embodiment of the present invention that system 10 is operative to record on substrate 12 a non-uniformly modified version of an initial image, such as CAM image 40. This is done, for example, using a scanning direct imaging system. In an embodiment of the invention, suitable circuitry for non-uniformly modifying the initial image is implemented, for example, in software running on a general purpose computer. Thus as seen in FIG. 1, in accordance with an embodiment of the invention, CAM image 40, which represents a pattern to be formed on substrate 12, is provided to a non-uniform pattern computer 44 to generate a non-uniformly modified control image 46. The non-uniform modification of CAM image 40 makes the pattern 14 to be recorded on substrate 12 fit in a highly precise manner with an electrical circuit pattern portion already formed on substrate 12, or with an electrical circuit pattern portion, or image of an electrical circuit pattern portion, already formed on some other substrate layer.

In one embodiment of the invention a non-uniformly modified control image 46, which is for example a non-uniform version of CAM image 40, is initially generated and then is recorded on substrate 12. In another embodiment of the invention, a control file causing system 10 to non-uniformly record CAM image 40 on substrate 12 is generated. In this embodiment the control file provides suitable controlling instructions to system 10 to control a non uniform rate at which modulator 24 modulates beam 22, and optionally a non uniform rate of relative displacement between substrate 12 and system 10.

One result of recording a non-uniformly modified version of CAM image 40 is that some pattern portions 16, corresponding to electrical circuit portions on layers of different electrical circuits, are moved and/or are magnified and/or are shape changed relative to other pattern portions 16. This is helpful when a pattern, such as an electrical circuit portion, that is already formed on another layer of substrate 12 includes one or more portions that is moved, or that is magnified (or demagnified), or that is shape changed relative to other portions, or relative to an absolute location, magnification or shape. Non-uniform modification of an input control image, such as CAM image 40, can thus provide for suitable movement, scaling and/or shape change of individual pattern portions 16. This modification may be performed such that the various pattern portions are modified independently of other pattern portions. When a version of CAM image 40 is thus recorded on the surface of substrate 12 by system 10, each resulting pattern portion 16 precisely fits an actual location necessitated by a pattern portion that has already been formed.

Figure 2A:
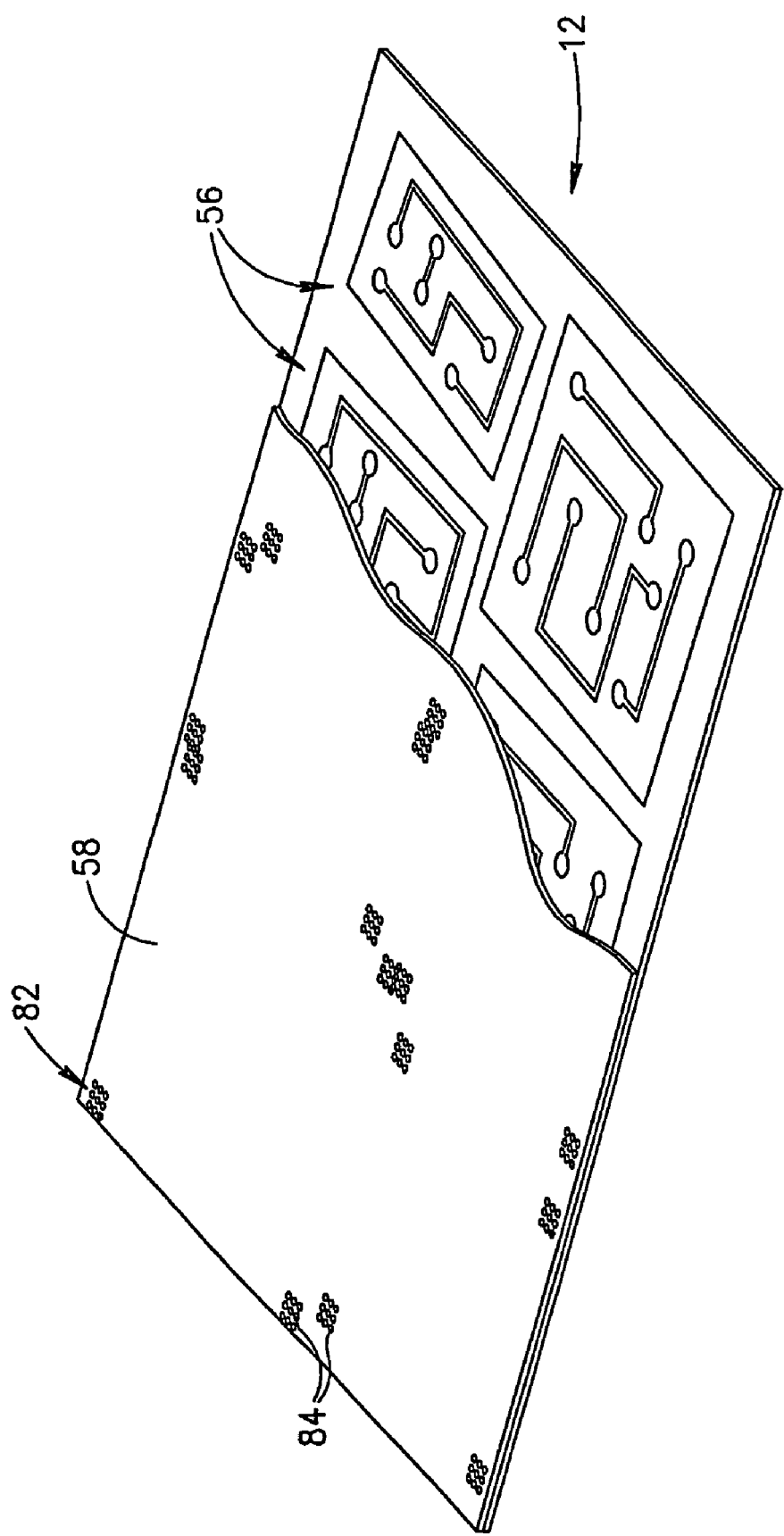
FIG. 2A is a partially cut-away pictorial illustration of a substrate suitable for use with the system of FIG. 1.

Reference is made to FIG. 2A which is a partially cut-away pictorial illustration of a substrate, such as substrate 12, suitable for use with system 10. As seen in FIG. 2A, and additionally in FIG. 1, substrate 12 includes a plurality of electrical circuit portions 56. Each of the electrical circuit portions 56, is defined by a pattern of conductive metal on an isolating substrate, such as a dielectric substrate, and is to become a circuit layer in a different printed circuit board device. Substrate 12 additionally includes a surface layer 58 overlaying electrical circuit portions 56. Surface layer 58 is, for example, a composite layer of an isolating base, such as a dielectric fiberglass and epoxy substrate, and a metal foil, such as copper, overlaid with a photosensitive photoresist. Because the electrical circuit portions 56 are beneath surface layer 58, they are shown in FIG. 1 with broken lines 60.

Returning to FIG. 1, it is seen that although similar pattern portions 16 in CAM image 40 are generally uniformly sized, positioned and shaped, the placement of corresponding electrical circuit portions 56 on substrate 12 is not uniform. Some of the electrical circuit portions 56 are not at their expected location, or their size has been changed or their overall shape has been changed respective of a location, size or shape anticipated from CAM image 40. For example, one of the electrical circuit portions 56, portion 62, is both out of position and is reduced in size. Another of the electrical circuit portions 56, portion 64, is both out of position and is enlarged in size. Another of the electrical circuit portions 56, portion 66, is not rectangular, but rather its shape is changed such that it is trapezoidal.

It is noted that in order to clearly show concepts underlying embodiments of the present invention, deformations occurring in electrical circuit portions 56, and in image portions recorded in response to electrical circuit portions 56, are seen as being highly and greatly exaggerated. In actuality, deformations occurring in electrical circuit portions 56 typically are comparatively small and exhibit a systematic behavior, such as a systematic drift in location and/or drift in size, as would be expected from the stretching of a substrate 12 or due to optical distortions occurring during the exposure of previously formed electrical circuit portions.

In FIG. 1 it is also seen that the non-uniformly modified control image 46 has been non-uniformly modified, relative to pattern 14. Such non-uniform modification accommodates the actual size, location and shape of each of electrical circuit portions 56. In an embodiment of the invention, accommodation of the actual size, location and shape of each electrical circuit portion 56 is performed independently for each portion 56. Alternatively, the entire image is non-uniformly modified on a global basis.

Figure 2B:
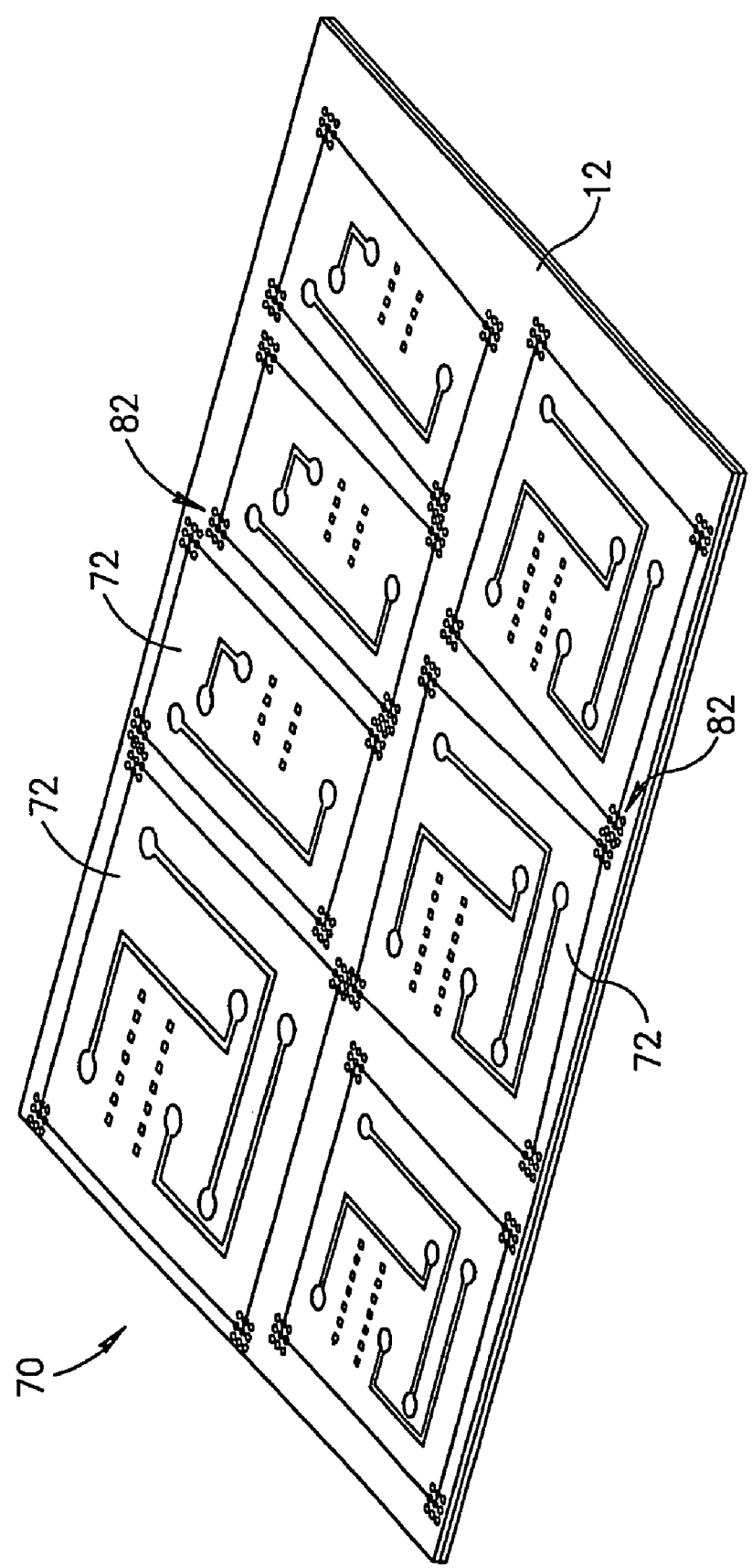
FIG. 2B is a pictorial illustration of a substrate after exposure using the system of FIG. 1.

As a result, as seen in FIG. 2B, which is a pictorial illustration of a substrate after exposure using system 10, a non-uniformly modified version of CAM Image 40 is recorded on surface 58. Recorded image 70 defines new electrical circuit portions 72 that complement already-formed electrical circuit portions 56. Because of the non-uniform modification of recorded image 70 compared to CAM image 40, recorded image 70 precisely fits already formed electrical portions 56 that are located either on substrate 12 (sequential build up mode) or on other substrates. Consequently, each of the new electrical circuit portions 72 precisely matches the location, size and shape of the already formed electrical circuit portions 56, regardless of actual changes in their location, size or shape relative to each other or relative to an ideal image, resulting, for example, from a stretching of substrate 12.

Figure 3:
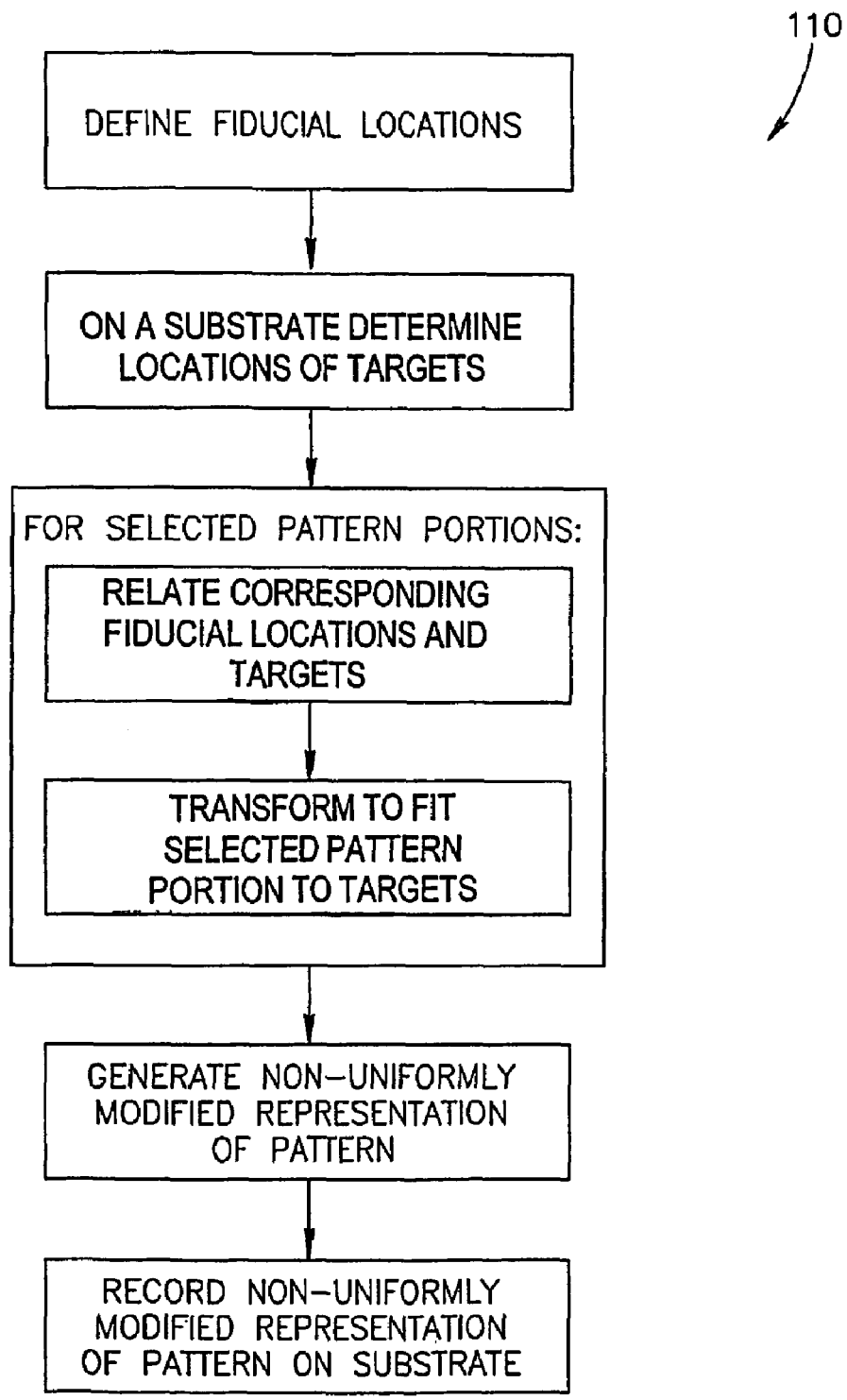
FIG. 3 is a flow diagram of a methodology for exposing electrical circuits using the system of FIG. 1 in accordance with an embodiment of the invention.

Reference is now made to FIG. 3 which is a simplified flow diagram of a method 110 for non-uniformly modifying a CAM image 40 employed to record an image of electrical circuit using the system of FIG. 1 in accordance with an embodiment of the invention, and to FIGS. 4A - 4K which are simplified schematic illustrations of electrical circuit patterns useful in understanding the methodology of FIG. 3.

Figure 4A:
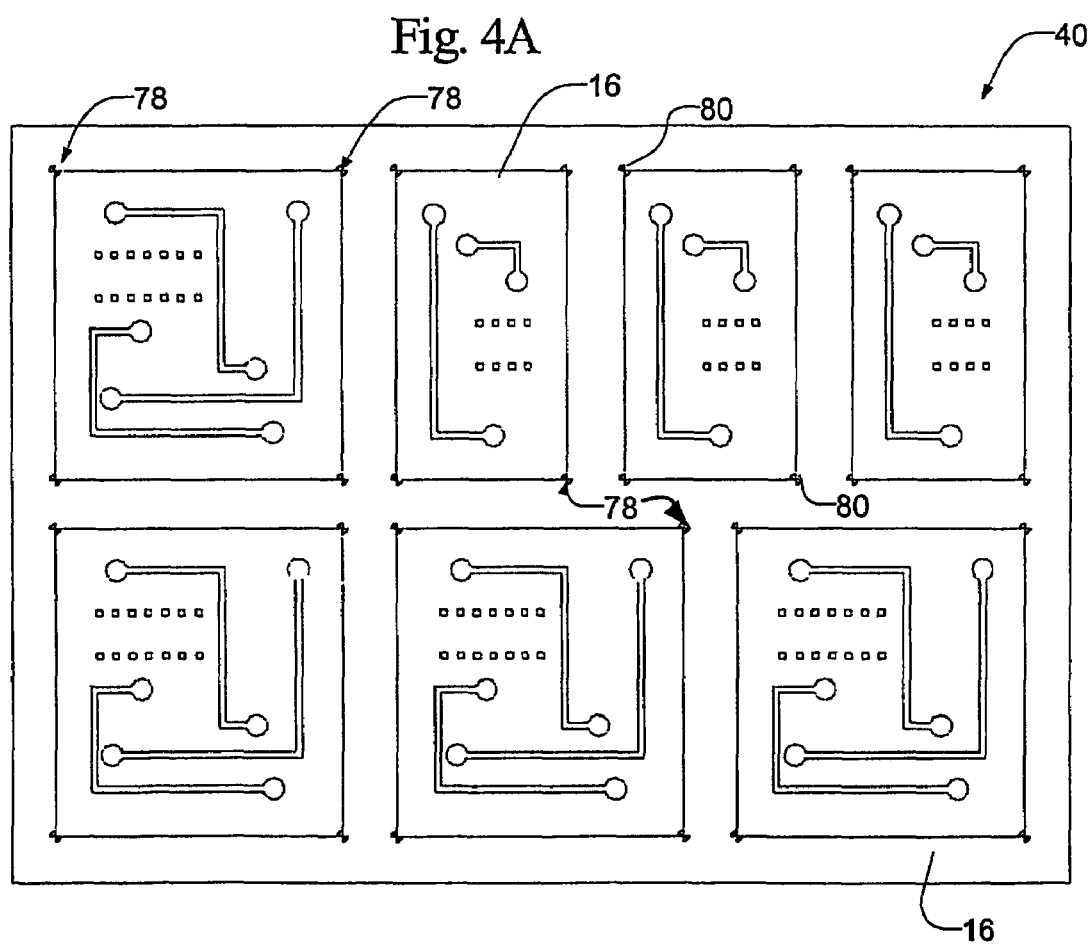
FIGS. 4A-4K are simplified schematic illustrations of computer files of electrical circuits useful in understanding the methodology of FIG. 3.

Method 110 commences with the operation, typically performed offline, prior to commencing the recoding of an electrical circuit pattern, of defining fiducial locations 78, for example in CAM image 40 (FIG. 1). The fiducial locations 78 may be specially defined locations in a CAM image, such as corners 80 surrounding each of pattern portions 16, fiducial locations arranged in a given array, or fiducial locations that are otherwise suitably located. Fiducial locations may be specifically associated with a single pattern portion 16, or shared by at least two pattern portions 16. An example of a CAM image 40 of a pattern 14 to be recorded on substrate 12, indicating locations where fiducial locations 78 have been defined at corners 80, is seen in FIG. 4A. It is noted that optionally, fiducial locations are special purpose locations interspersed throughout CAM Image 40, such as at corners 80, or locations that correspond to selected features, such as pads or vias, in the CAM image 40 of an electrical circuit pattern portion.

Next, prior to recording an image on substrate 12 with system 10, the locations of targets, indicated by reference numerals 82 in FIGS. 4B-4K, are determined in the substrate 12 onto which a pattern 14 is to be recorded.

Figure 4B:
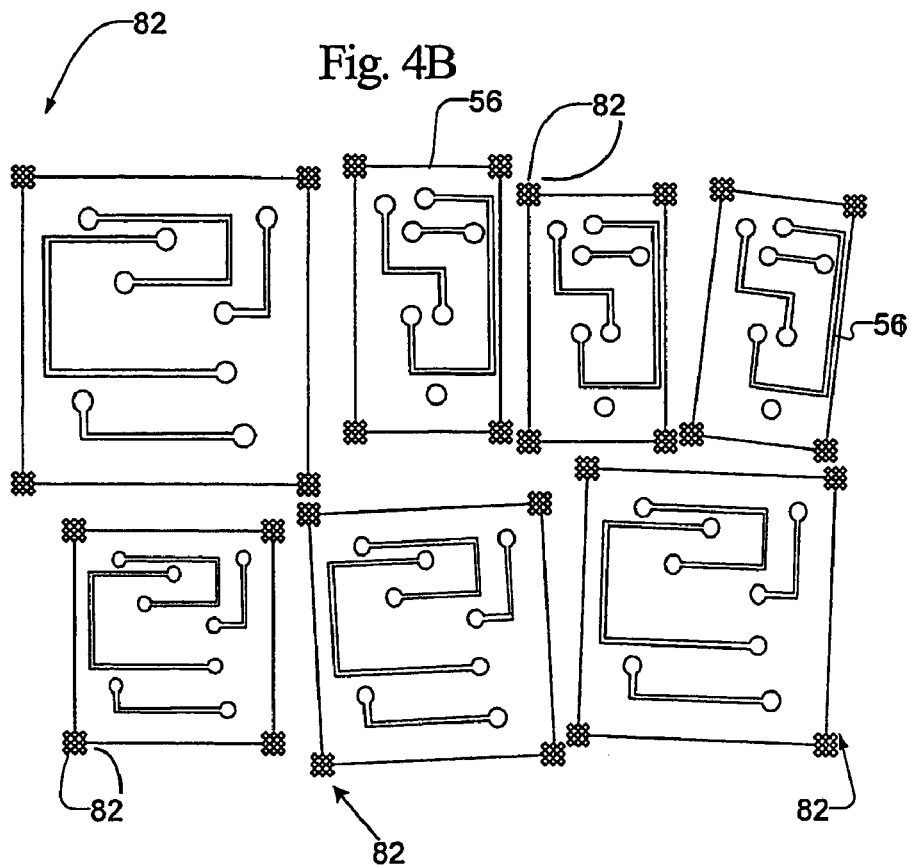
Figure 4C:
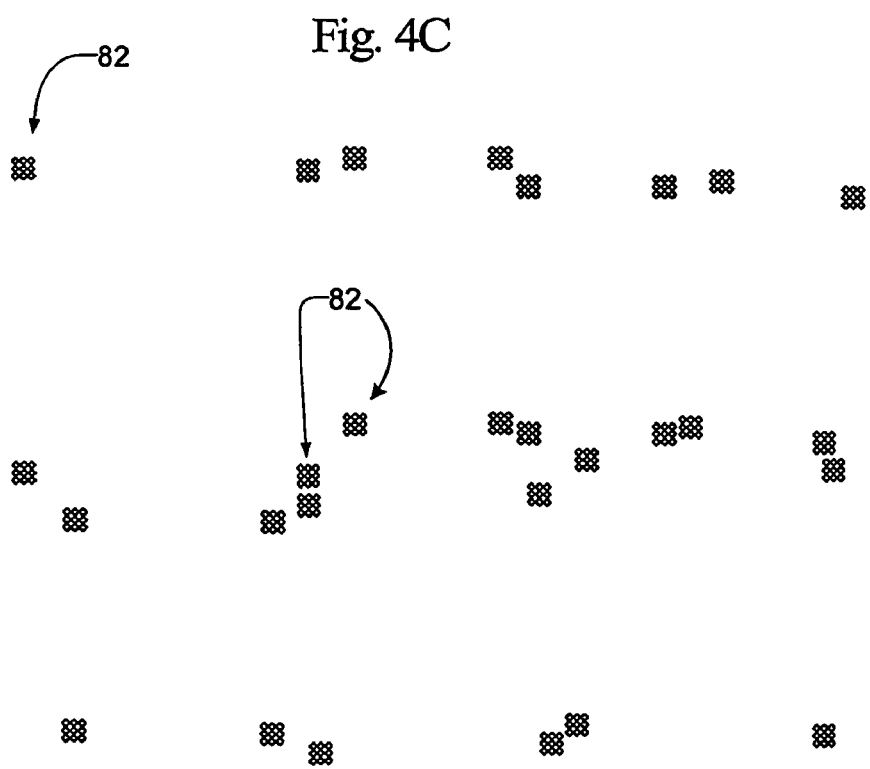

FIG. 4B shows the location of targets 82 in relation to electrical circuit portions 56 that are already formed, such as on a previously formed layer of substrate 12. FIG. 4C shows the locations of targets 82, without electrical circuit portions 56, such as may be found in a substrate 12 that is clad with a copper layer and photoresist (not shown) prior to exposure in system 10. The locations of targets 82 may be stored in a file. In FIG. 4B it is seen that targets 82 are distributed along the surface of substrate 12 according to a given relationship with electrical circuit portions 56. An object of method 110 is to record a version of CAM image 40 in which fiducial locations 80 in the CAM image 40 precisely fit corresponding alignment targets 82 on substrate 12. The result of such non-uniform modification is to precisely align recorded image 70 and electrical circuit portions 56 that are already formed, for example on a previously formed layer of substrate 12.

In the example seen in FIGS. 2A and FIG. 4B, each of targets 82 on substrate 12 is an array of microvias 84 that are formed in the surface of a substrate 12 in a precise orientation relative to an electrical circuit portion 56. Microvias 84 are convenient to use as targets 82 because, as seen for example in FIG. 2A, in addition to being formed in a precise location relative to an electrical circuit portion 56, they are readily visible from the surface of substrate 12, sometimes even if covered by an opaque overlay such as surface layer 58. It is noted however that any other suitable targets 82, precisely located with respect to an electrical circuit portion 56 that is already formed, may be used. An example of another suitable form of target 82 includes targets that are a given shape of copper (not shown) formed, for example, along with an electrical circuit Layer 58 may need to be selectively removed, e.g. by skiving, to unveil such targets. Optionally, the precise location of such targets may be ascertained, for example, by X-ray imaging, acoustic positioning or other suitable methodology.

In accordance with an embodiment of the invention, the respective locations of targets 82 on a substrate 12 are determined using sensors 34 in combination with location determinator 38. Alternatively, the locations of targets 82 on a substrate 12 are determined using a separate X-Y measuring table operative to output a suitable file indicating the respective locations of targets 82. The locations of targets 82 may be determined particularly for each substrate 12 or on a case by case (substrate by substrate) basis. Optionally, the respective locations of targets 82 are determined once for an entire batch of similar substrates 12. The choice of whether to determine the locations of targets for each substrate, or for a batch of substrates, is, for example, a function of the required precision at which a pattern 14 needs to be recorded on a substrate 12, and time available.

Optionally, determination of the respective location of targets 82 is made using an inspection output 86 of an Automated Optical Inspection system (not shown) indicating any pattern deformations on an inspected substrate. Such an Inspection output 86 may be obtained during the automated optical inspection of electrical circuit portions 56, as commonly performed in printed circuit board fabrication. An example of a suitable inspection output 86 is described in copending U.S. patent application entitled, "System and Method for Inspecting Electrical Circuit Patterns for Deformations", Ser. No. 60/376,872, the disclosure of which Is incorporated herein by reference in its entirety. When employing such an inspection output 86, sensors 34 sense the locations of selected targets which are then used to determine the general location of substrate 12. Inspection output 86 is employed to record a non-uniformly modified version of CAM Image 40 on substrate 12.

Figure 4D:
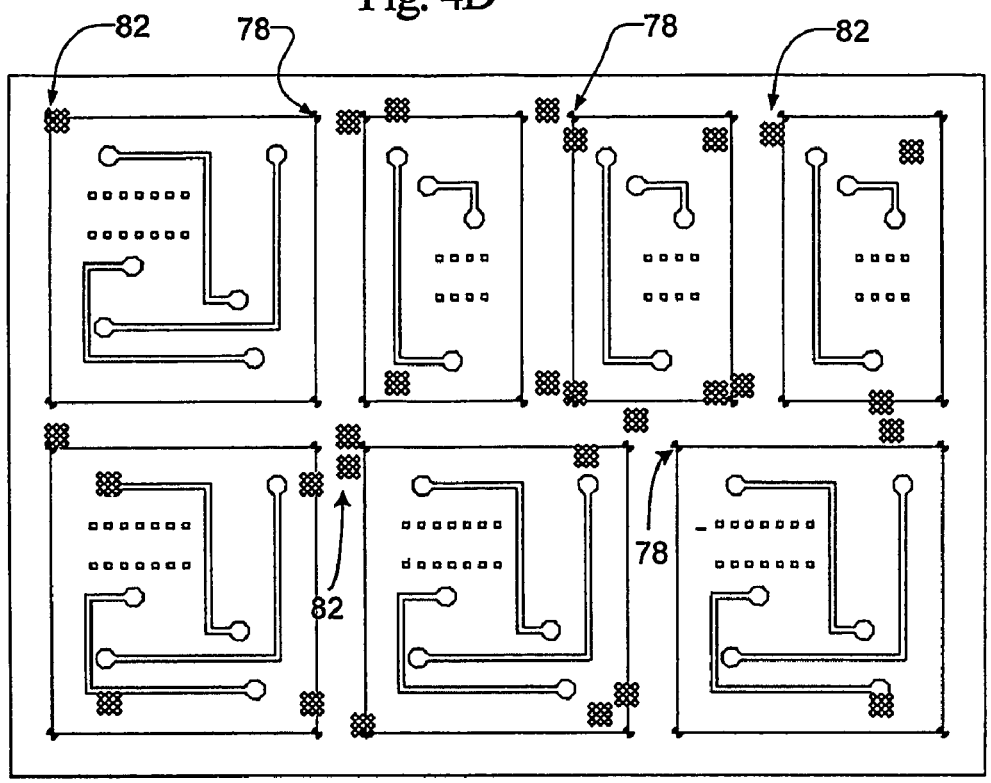

Returning now to FIG. 3, for selected pattern portions, fiducial locations 78 in a CAM image 40 are related to corresponding targets 82 on substrate 12. In FIG. 4D, fiducial locations each representing a location in an ideal electrical circuit, are overlaid with targets 82, each representing an actual location in a partially manufactured electrical circuit, with respect to which a recorded version of CAM image 40 is to be aligned. The difference in location between fiducial locations 78 and targets 82 is clearly seen.

In accordance with an embodiment of the invention, non-uniform modification of CAM image 40 is done, for example, by separately transforming each of selected pattern portions 16 in CAM image 40 so that each pattern portion 16 fits a corresponding electrical circuit portion already formed on substrate 12.

Figure 4E:
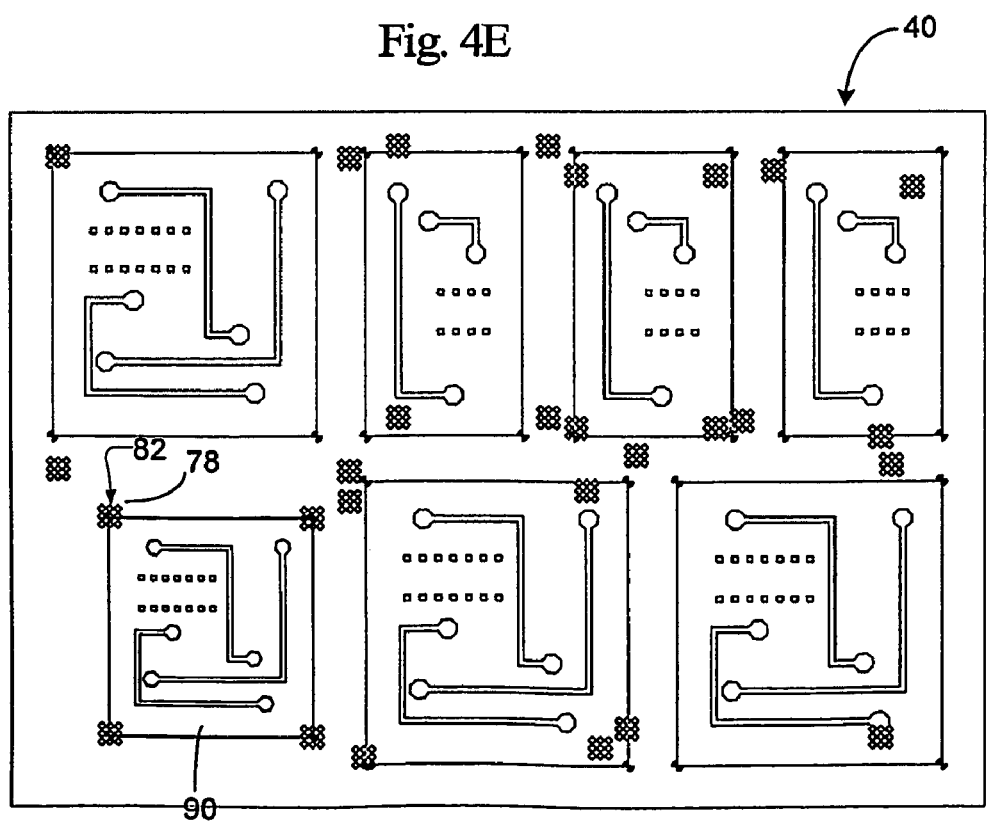

As seen in FIG. 4E, a first pattern portion 90 in CAM image 40, shown in solid lines after translation, is scaled (reduced in size) and translated so that its fiducial locations 78 precisely match corresponding locations of targets 82 associated with an already formed electrical circuit pattern, such as on substrate 12.

Figure 4F:
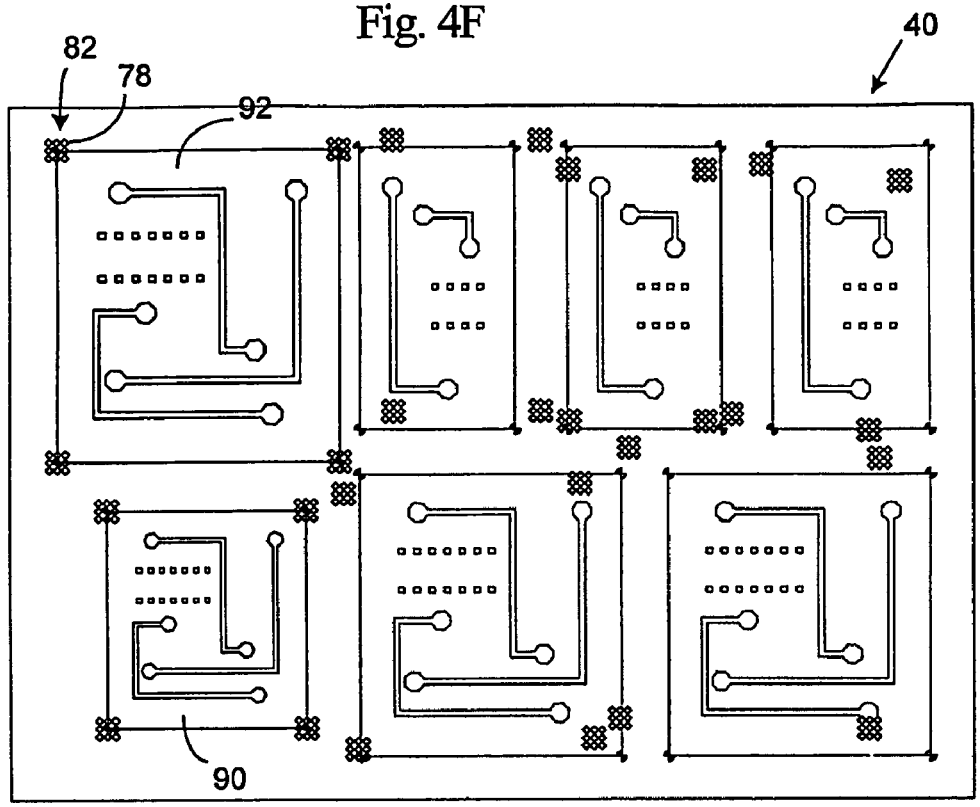

As seen in FIG. 4F, a second pattern portion 92 in CAM image 40, shown in solid lines after translation, is scaled (enlarged in size) and translated so that its fiducial locations 78 precisely match corresponding locations of targets 82 associated with an already formed electrical circuit pattern, such as on substrate 12.

Figure 4G:
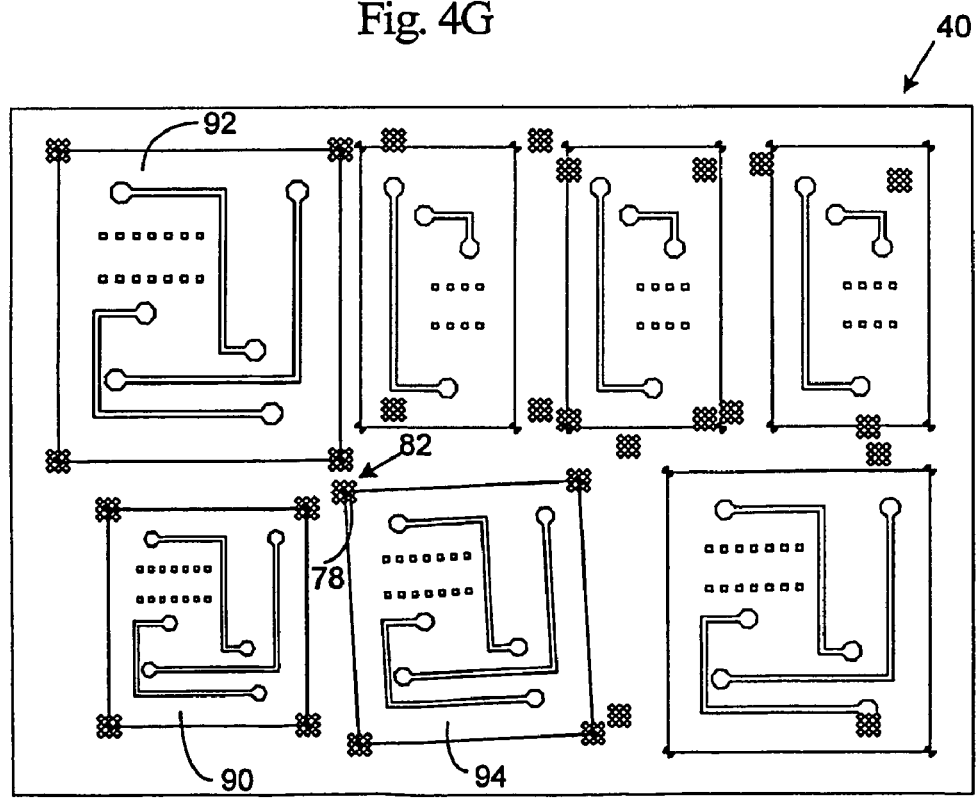

As seen in FIG. 4G, a third pattern portion 94 in CAM image 40, shown in solid lines after translation, is scaled (reduced in size), translated and rotated so that its fiducial locations 78 precisely match corresponding locations of targets 82 associated with an already formed electrical circuit pattern, such as on substrate 12.

Figure 4H:
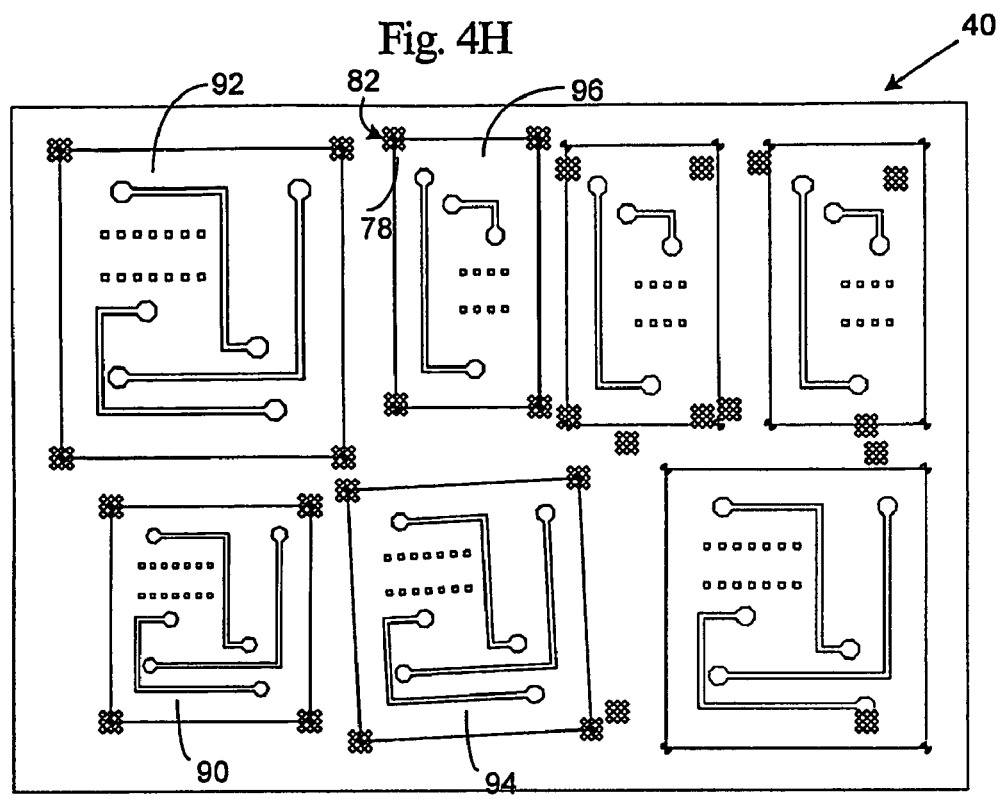

As seen in FIG. 4H, a fourth pattern portion 96 in CAM image 40, shown in solid lines after translation, is scaled and translated so that its fiducial locations 78 precisely match corresponding locations of targets 82 associated with an already formed electrical circuit pattern, such as on substrate 12.

Figure 4I:
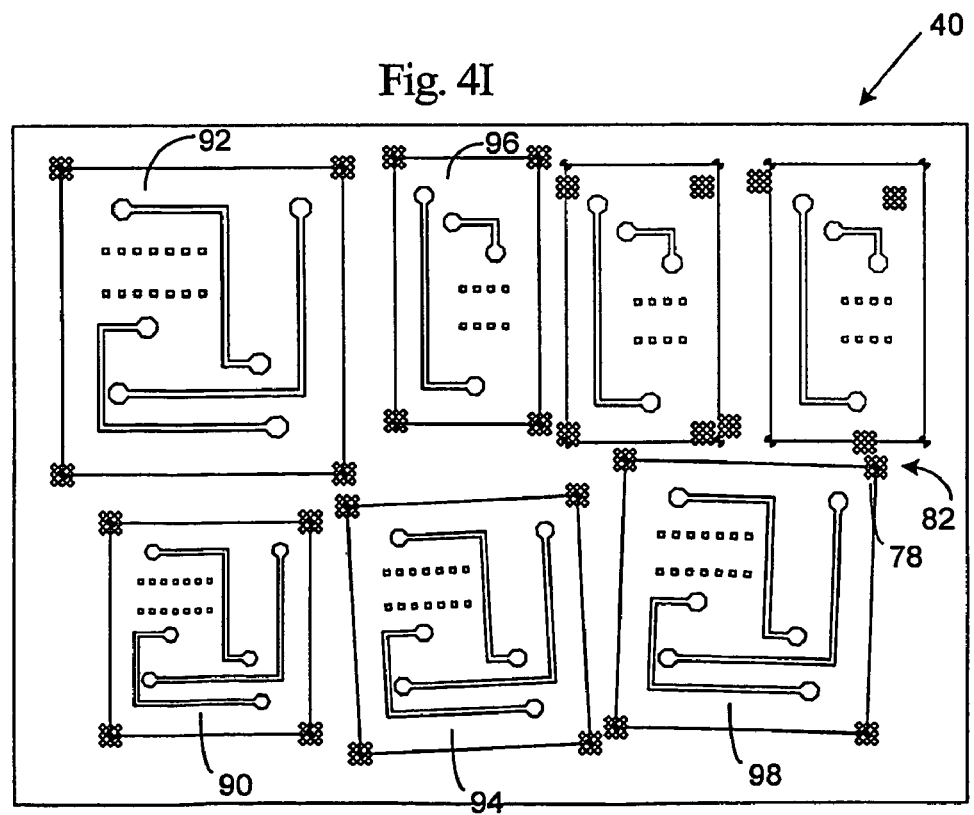

As seen in FIG. 4I, a fifth pattern portion 98 in CAM image 40, shown in solid lines after translation, is translated and rotated so that its fiducial locations 78 precisely match corresponding locations of targets 82 associated with an already formed electrical circuit pattern, such as on substrate 12.

Figure 4J:
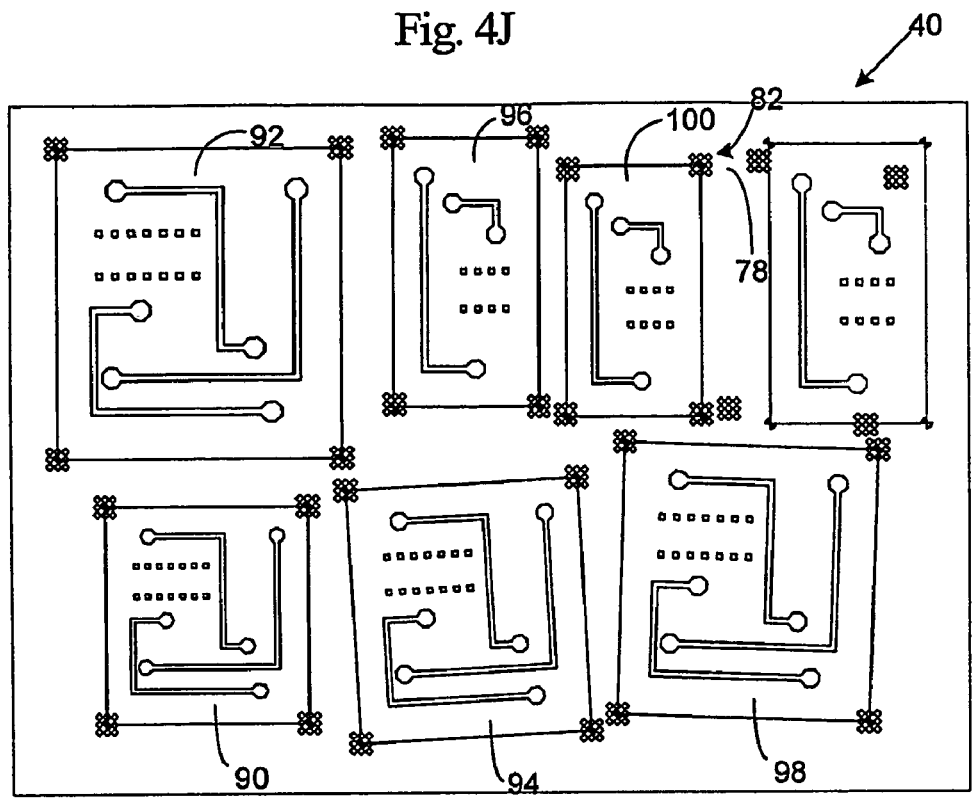

As seen in FIG. 4J, a sixth pattern portion 100 in CAM image 40, shown in solid lines after translation, is scaled (reduced in size) and translated so that its fiducial locations 78 precisely match corresponding locations of targets 82 associated with an already formed electrical circuit pattern, such as on substrate 12.

Figure 4K:
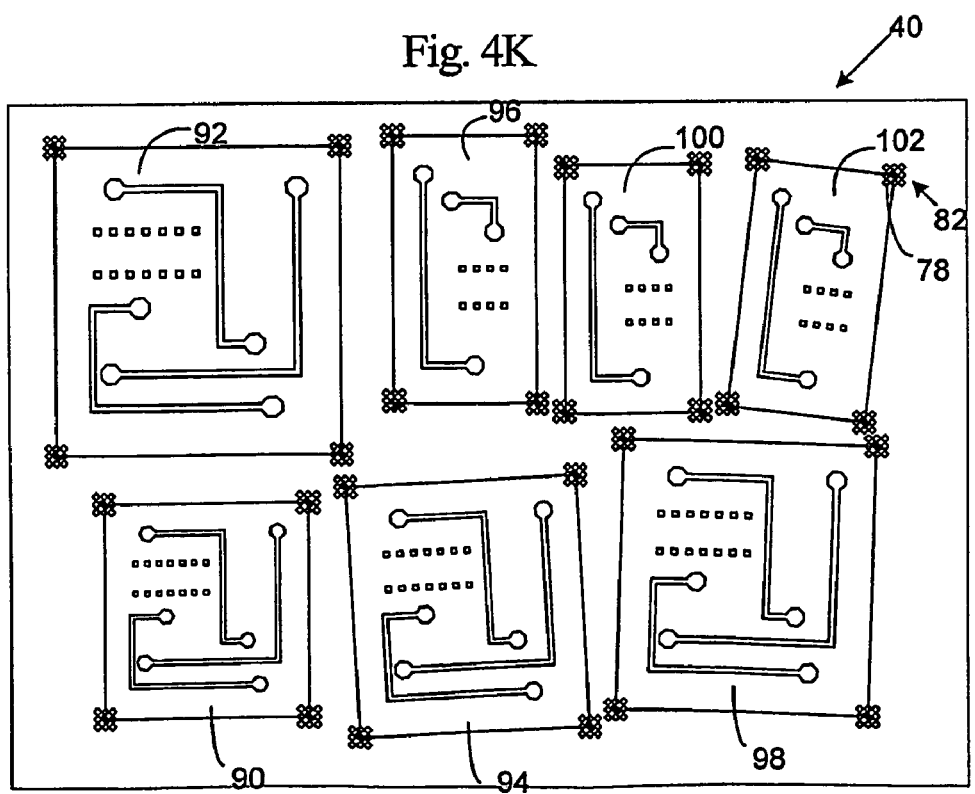

As seen in FIG. 4K, a seventh pattern portion 102 in CAM image 40, shown in solid lines after translation, is scaled (reduced in size), translated and rotated so that its fiducial locations 78 precisely match corresponding locations of targets 82 associated with an already formed electrical circuit pattern, such as on substrate 12.

In accordance with an embodiment of the invention, not all of the above transformations, translation, scaling and rotation, are performed on each pattern portion. Instead, an appropriate translation, scaling, and rotation is performed to independently fit each pattern portion to the complementary portion of an already formed electrical circuit portion. For example, in accordance with an embodiment of the invention, it is assumed that the difference between a CAM image and an already formed pattern portion is sufficiently small such that a suitable fit between an image to be recorded and the already formed pattern portion can be obtained simply by translating a pattern portion 90-102 in a non-uniformly modified version of CAM image 40. In such mode of operation, fiducial locations 78 associated with each pattern portion in the non-uniformly modified version of CAM image 40 are recorded so as to best fit (but not necessarily precisely fit) the corresponding locations of corresponding targets 82.

In accordance with an embodiment of the invention individual pattern portions are simply translated, without scaling and without rotation. A translation factor for translating a pattern portion is computed for each selected pattern portion 16 in response to a difference between an actual measured location of alignment targets, and an expected location of where the alignment targets should be. Targets on substrate 12 are measured, and CAM image 40 initially is uniformly scaled in response to the measured locations of selected targets. In accordance with an embodiment of the invention, targets that are respectively located near the corners of substrate 12 are employed for the uniform scaling operation. Each pattern portion to be moved is assigned a center point. The location of the center point is then translated as a function of the weighted affect of the difference between an actual measured location of targets and a corresponding expected location, represented by a fiducial location in the uniformly scaled CAM image 40. The pairs of actual target locations and expected locations may be for pairs located on the entire substrate, or any subset thereof. In accordance with an embodiment of the invention, the weight applied to each pair of measured target locations and their corresponding expected locations, for moving a given pattern portion, is a function of a distance from the center point of the pattern portion to be moved.

The following fragment of a software routine, in the C++ programming language, is employed, in the best mode of an embodiment of the invention, as presently known to the inventors, to independently translate selected pattern portions 16, without scaling and without rotation:

```
for (int sl = 0; sl < pair_arrs.get_num_slices( ); ++sl)
{
    for (LDFPointPair *ppr = pair_arrs.get_list(sl)
        ->first( ); ppr; ppr =
pair_arrs.get_list(sl) ->next( ))
    {
        cmp = ppr->get_computed( );
        act = ppr->get_measured( );
        locdvx = act.x - cmp.x;
        locdvy = act.y - cmp.y;
        dist = cmp.distance(rec_center);
        if (almost_equal(dist,0.0))
        {
            devs.x = locdvx;
            devs.y = locdvy;
            break;
        }
        weight = 1.0 / pow(dist,alpha_pow);
        tot_weights += weight;
        xsum += locdvx * weight;
        ysum += locdvy * weight;
    }
    if (exact_occured)
        break;
}
if (!exact_occured)
{
    devs.x = xsum / tot_weights;
    devs.y = ysum / tot_weights;
}
return 0;
}
```

It is thus appreciated from the foregoing that the process of separately transforming each of the pattern portions 90-102 so that the respective fiducial locations of each pattern portion fit the locations of corresponding targets 82 on substrate 12, results in a non-uniformly modified representation of CAM image 40. In accordance with an embodiment of the invention, such a non-uniformly modified representation of CAM image 40 is generated as a file, such as a raster file, and stored as a non-uniformly modified control image 46. The non-uniformly modified control image 46 is used in place of CAM image 40 to record a recorded image 70 of new electrical circuit portions 72 onto substrate 12.

Alternatively, differences between the respective locations of fiducial locations 78 and targets 82 is used to generate a control file which non-uniformly controls the delivery of data, or the rate of translation of substrate 12, so that a non-uniform version of CAM image 40 is recorded on substrate 12.

Figure 5:
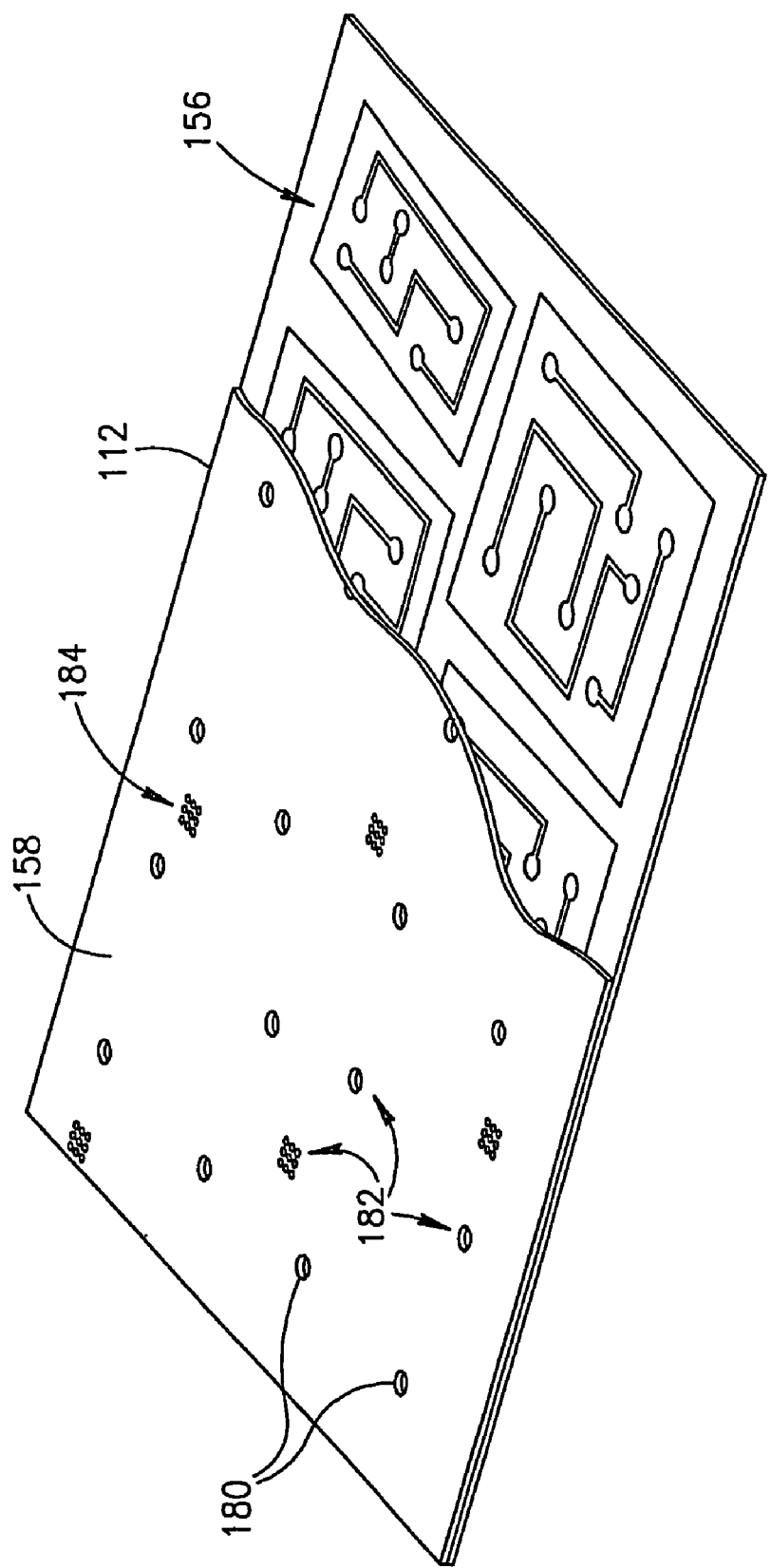
FIG. 5 is a partially cut-away pictorial illustration of another substrate suitable for use with the system of FIG. 1.
Figure 6:
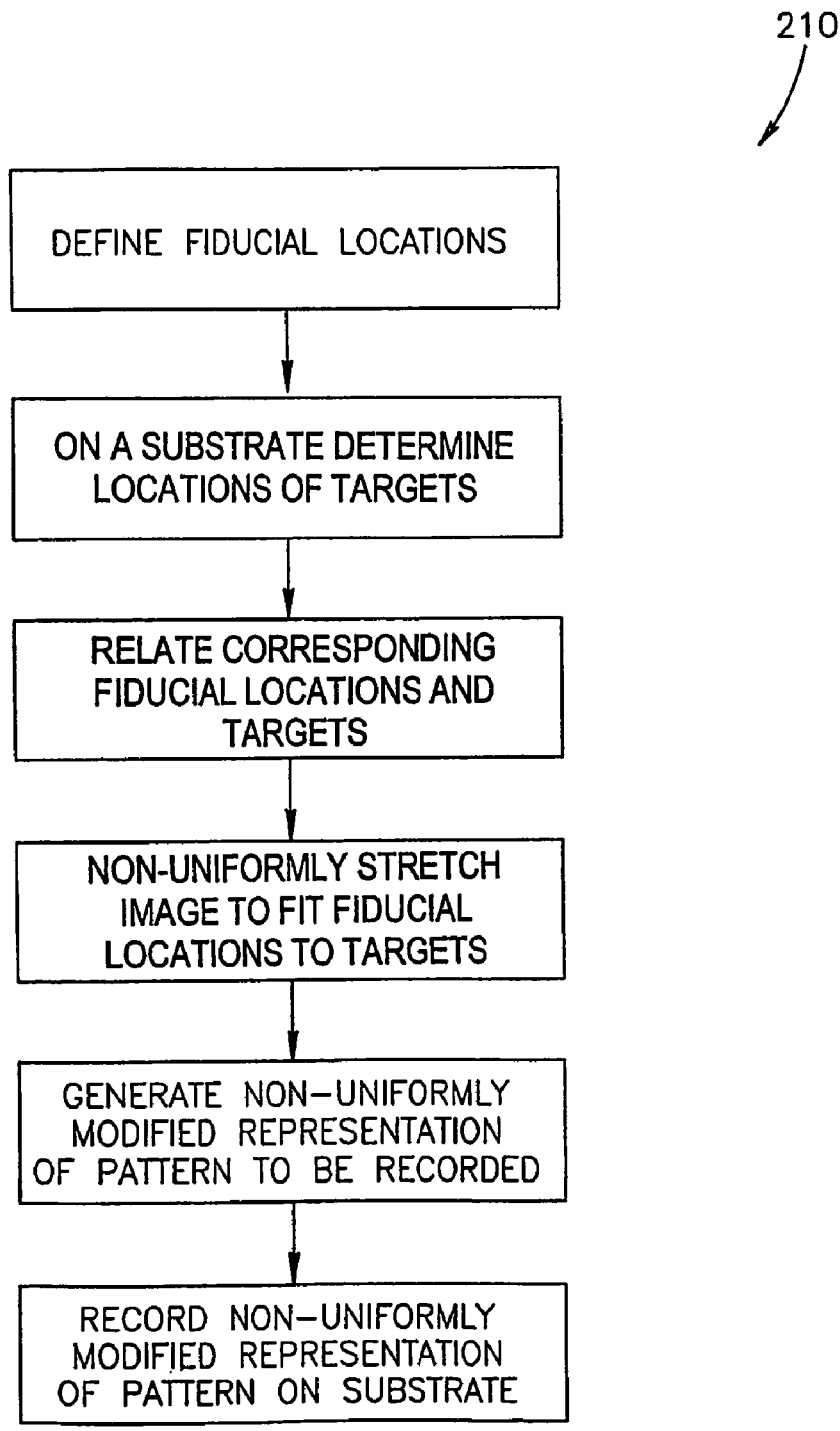
FIG. 6 is a flow diagram of a methodology for exposing electrical circuits using the system of FIG. 1 in accordance with another embodiment of the invention.

Reference is now made to FIGS. 5-7E. FIG. 5 is a partially cut-away pictorial illustration of another substrate 112 suitable for use with the system of FIG. 1. FIG. 6 is a flow diagram of a method 210 for recording a non-uniformly modified CAM image 40 on a substrate using the system of FIG. 1 in accordance with another embodiment of the invention. FIGS. 7A-7E are simplified schematic illustrations of electrical circuit patterns useful in understanding the methodology of FIG. 6.

Method 210 commences with the operation, typically performed offline, prior to commencing recording an electrical circuit pattern on a substrate 112, of defining fiducial locations 178, for example in a CAM image 40 (FIG. 1). In an embodiment of the invention, the fiducial locations 178 correspond to the locations of components, such as vias or pads, to be formed in an electrical circuit. Thus, for example, fiducial locations 178 are assigned to locations in CAM image 40 corresponding to locations where vias 180 are to be formed. Alternatively and additionally, fiducial locations 178 are assigned to other specifically defined locations that may or may not be associated with a feature to be formed in any particular electrical circuit, such as at other locations 181. A CAM image 40 of a pattern 14 to be recorded on substrate 12, showing the assignment of fiducial locations 178 to locations where vias 180 are to be formed in an electrical circuit, and at other locations 181, is seen in FIG. 7A.

In the next operation, prior to recording an image with system 10, the locations of targets, designated by reference numeral 182, on the substrate 112 onto which a pattern 14 is to be recorded are determined. Targets 182 are distributed on substrate 112 such that they are to be visible, e.g. by sensors 34, by X-ray sensors (not shown), by an external automated inspection system (not shown) or by any other suitable sensor. Targets 182 may be formed on an electrical circuit layer that is covered by a surface layer 158 such as in a sequential buildup type arrangement. Alternatively, targets are formed on a separate electrical circuit substrate layer (not shown) that is to be combined together with substrate 112 to form a printed circuit board. Each of the targets 182 corresponds to a fiducial location, such as at vias 180 or at other locations, 181 in CAM image 40.

Figure 7B:
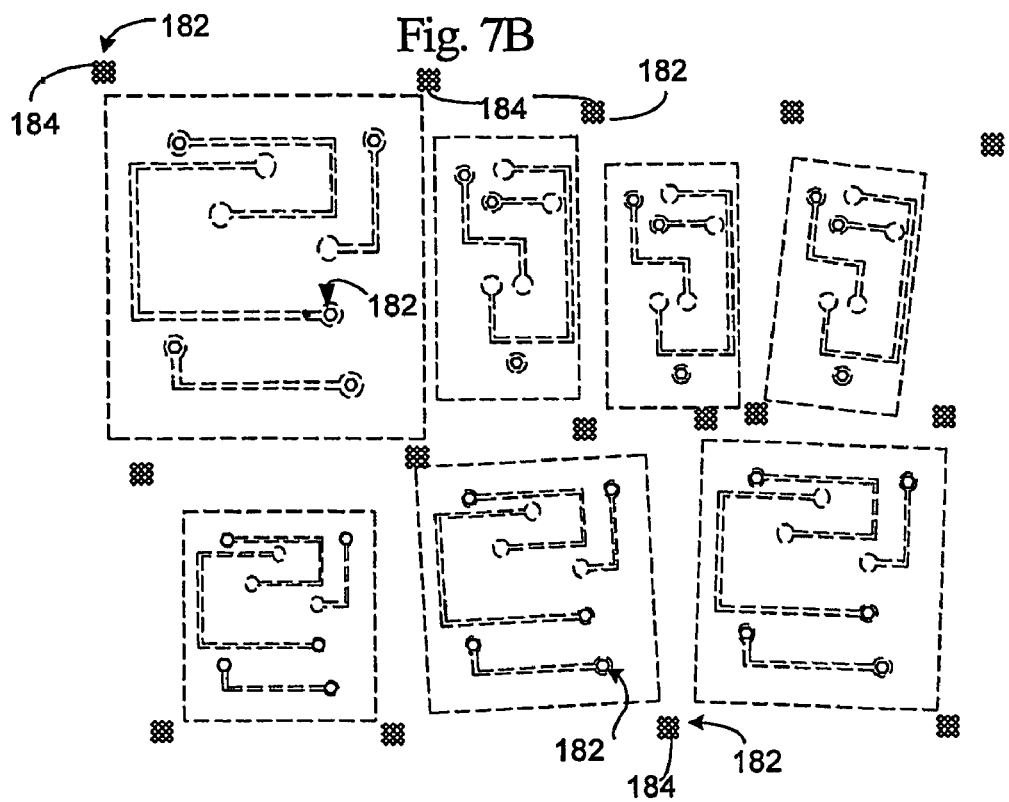

As seen in FIG. 5 and FIG. 7B, some targets 182 on substrate 112 are associated with vias 180, and some of targets 182 on substrate 112 are associated with other locations 181. Vias 180 typically interconnect between electrical circuit patterns on surface layer 158 and electrical circuit portions 156 in a completed printed circuit board. Other targets 182, such as those that are associated with other locations 181, are formed, in the example seen, as an array of microvias 184. Any other suitable target may be used. Microvias 184, do not necessarily serve any functional purpose in a finished electrical circuit, however they are formed in the surface of a substrate 112 in a precise orientation relative to an electrical circuit portion 156, for example using laser micromachining equipment as known In the art.

Vias 180 and microvias 184 are particularly convenient to use as targets 182 because, as seen for example in FIG. 5, in addition to being formed in a precise location relative to an electrical circuit portion 156, they are visible from the surface of substrate 112, even if electrical circuit portions 156 are covered by an opaque overlay such as surface layer 158. It is noted that although vias 180 and microvias 184 are shown as examples of targets 182, other suitable form of target, precisely located with respect to an electrical circuit portion 156 that is already formed, may be used. For example, various pattern formations formed either as part of, or concomitantly with, electrical circuit portions 156 may serve as targets. Layer 158 may need to be selectively removed, e.g. by skiving, to unveil such targets. Optionally, the precise location of such targets may be ascertained, for example, by X-ray imaging, acoustic positioning or other suitable methodology.

Figure 7C:
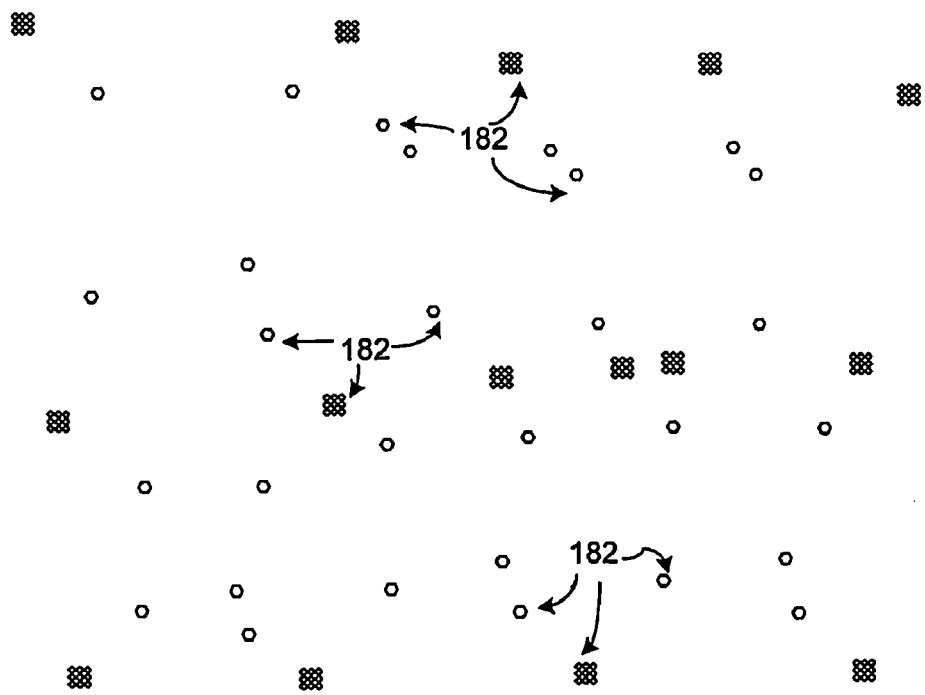

In accordance with an embodiment of the invention, the respective locations of targets 182 on a substrate 112 are determined using sensors 34 in combination with location determinator 38 (FIG. 1). The locations of targets 182 may be determined particularly for each substrate 112 on a case by case basis. Optionally, the respective locations of targets 182 are determined once for an entire batch of similar substrates 112. The choice of whether to determine the locations of targets for each substrate, or for a batch of substrates, is, for example, a function of the required precision at which a pattern 14 needs to be recorded on a substrate 112, and the time available. An illustration of a file showing the respective locations of targets 182 is seen in FIG. 7C.

Optionally, determination of the respective location of targets 182 is made using an X-Y measuring system separate from system 10, or using an Inspection output 86 (FIG. 1) of an Automated Optical Inspection system (not shown) indicating pattern deformations on an inspected substrate. Such an inspection output 86 may be obtained during the automated optical inspection of electrical circuit portions 156. An example of a suitable inspection output 86 is described in copending U.S. patent application entitled, "System and Method for Inspecting Electrical Circuit Patterns for Deformations", Ser. No. 60/376,872, the disclosure of which is incorporated herein by reference in its entirety for its description of inspection systems. When employing such an inspection output 86, sensors 34 sense the locations of selected targets which are then used determine the general location of a substrate 112. Inspection output 86 is employed to non-uniformly modify CAM Image 40.

Figure 7D:
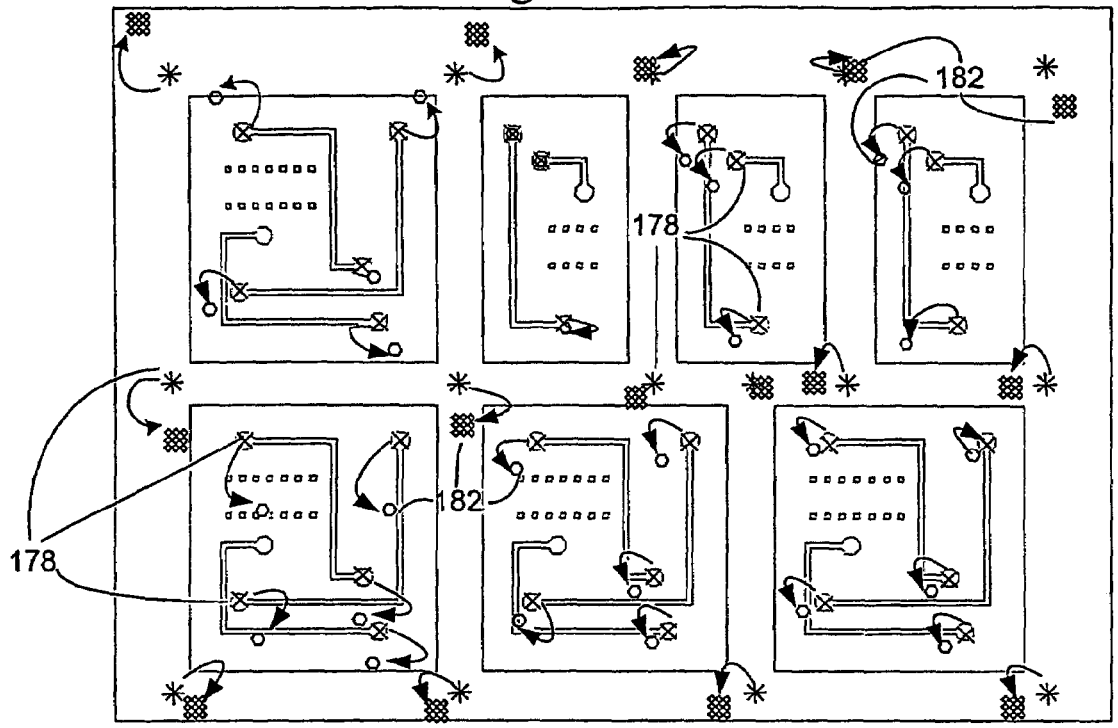

Returning now to FIG. 6, in the next operation fiducial locations 178 in various pattern portions of a CAM image 40 are related to corresponding targets 182 on substrate 112. This operation is illustrated in FIG. 7D in which a CAM Image 40 is overlaid with a representation of the locations of targets 182. The difference between fiducial locations 178, each representing a given location in an ideal electrical circuit, for example as represented by a CAM image 40, and targets 182, each representing an actual location in a partially manufactured electrical circuit is clearly seen.

In accordance with an embodiment of the invention, non-uniform modification of CAM image 40 is performed by non-uniformly transforming CAM image 40, for example by non-uniformly stretching (or contracting) CAM image 40, based on the difference between fiducial locations 178 and targets 182. The non-uniform transformation of CAM image 40 makes targets 182 in CAM image 40 fit the actual locations of targets 182 on substrate 112. This may be performed, for example, by inputting the respective locations of a collection of fiducial locations 178 and corresponding targets 182, and then non-linearly stretching CAM image 40 according to a suitable complex transform function. Such transformation may be performed globally or on a portion by portion basis for selected portions of CAM image 40.

Figure 7E:
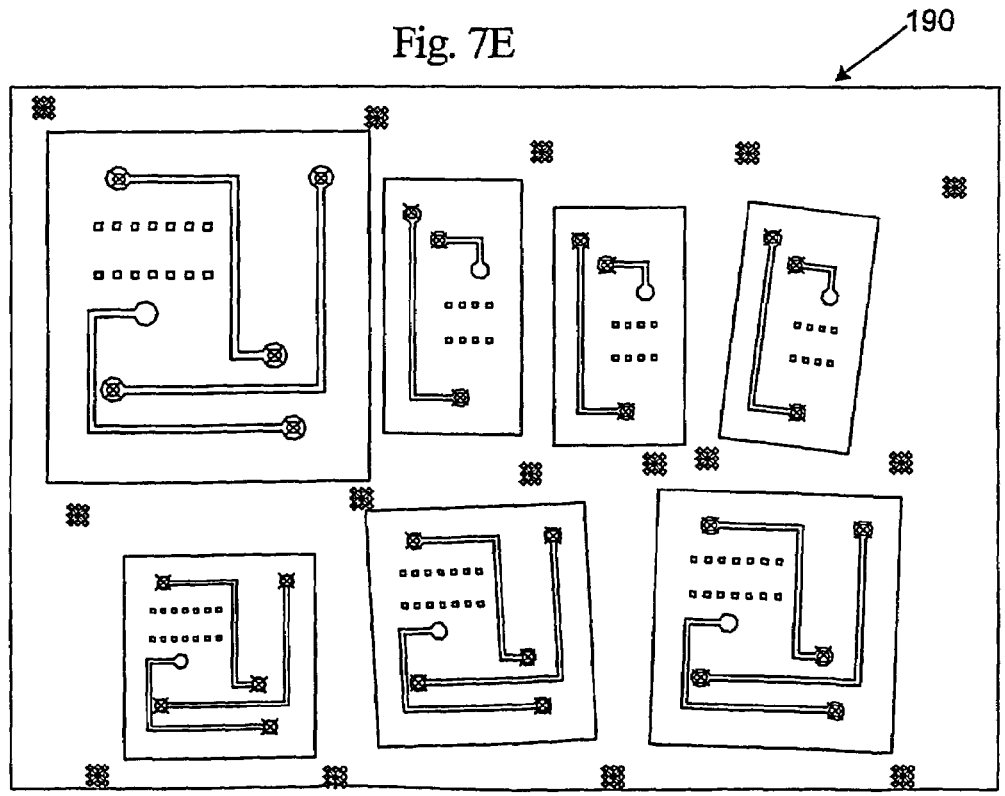

As seen in FIG. 7E, the process of fitting fiducial locations 178 to targets 182 generates a non-uniformly modified version 190 of CAM image 40 which can be recorded by system 10 on substrate 12 (FIG. 1). In accordance with an embodiment of the invention, the non-uniformly modified version 190 of CAM image 40 is operative to serve as a control image 46 which is transferred onto the surface of substrate 12 such that a recorded image 70 of new electrical circuit portions 72 is very closely aligned to electrical circuit portions 156 (FIG. 5) that are already formed on a substrate 112.

Figure 8:
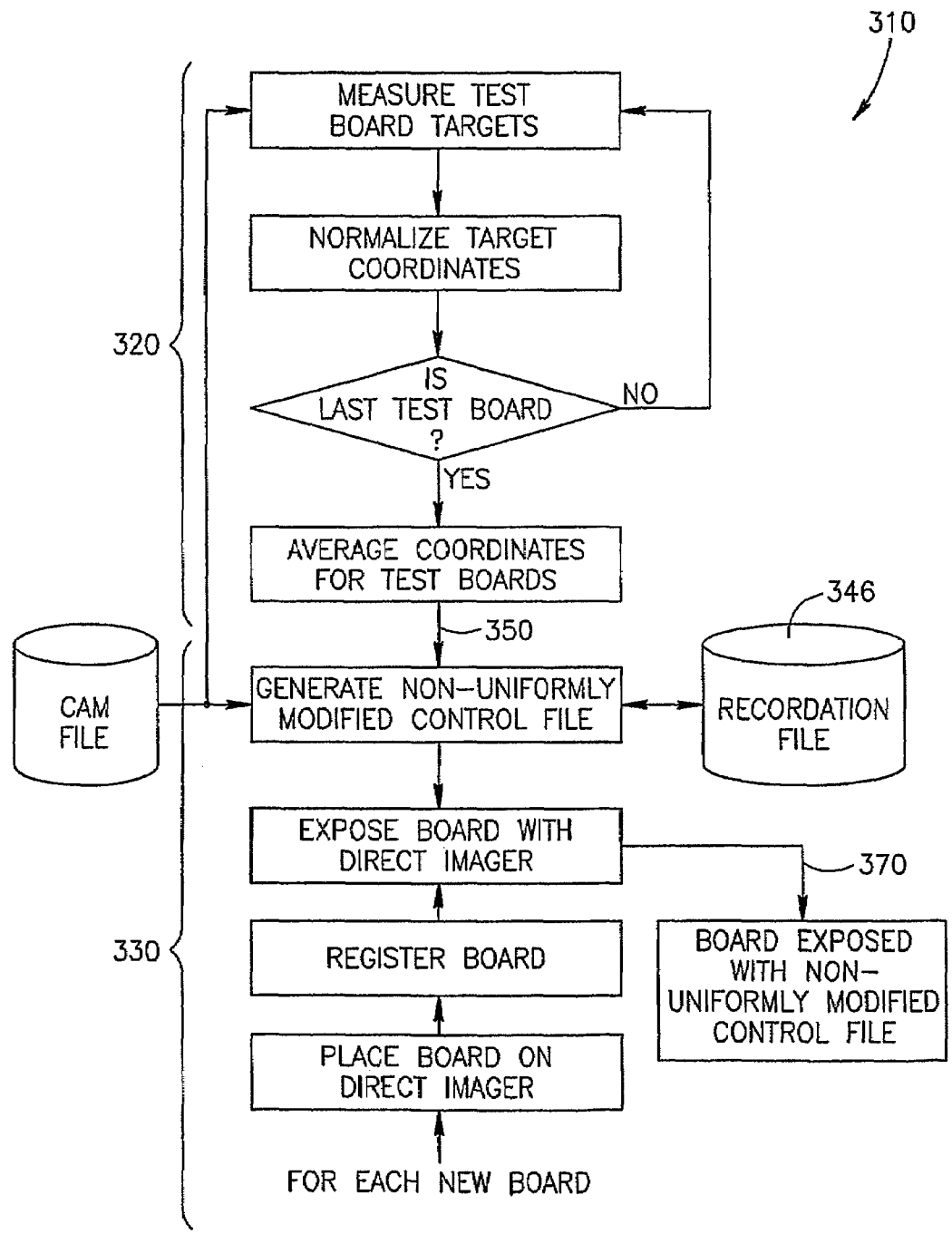
FIG. 8 is a simplified flow diagram of a method for exposing patterns on printed circuit boards in accordance with an embodiment of the invention.

Reference is now made to FIG. 8 which is a simplified flow diagram of a method 310 for exposing patterns on printed circuit boards in accordance with an embodiment of the invention. Method 310 includes two parts: a learn mode 320 in which a non-uniformly modified version of CAM image 40 (FIG. 1) is generated, and an imaging mode 330 in which the non-uniformly modified version of CAM image 40, designated recordation file 346, is transferred, without further substantial modification, so as to record a recorded image 370 on substrate 12. In accordance with an embodiment of the invention, recordation file 346 is a compressed raster image of the non-uniformly modified version of CAM image 40, although the use of a not compressed raster image may be used.

It is noted that the generation of a high resolution recordation file 346 in learn mode 320 can be highly computer resource intensive. In accordance with an embodiment of the invention, a recordation image is generated based on an averaging of the respective locations of targets associated with electrical circuit pattern portions 56 that have been formed on several, for example 10 or more, previously formed layers, such as substrates 12, of in-fabrication electrical circuits. The average respective locations of targets in the various substrates is then used to generate recordation file 346. This mode of operation is suitable, for example, in a batch mode operation in which the same recordation file is to be recorded on all substrates in a batch of substrates.

In an initial operation of the learn mode 320 of method 310, the respective locations of targets on a substrate are measured and compared with an expected location. The expected location is provided, for example, by a file containing CAM image 40. Next the measured locations are normalized by eliminating scaling, offset and rotation from measurement results, to facilitate the determination of an average location of each target as found on several different substrates. In accordance with an embodiment of the invention, the following function, in the MATLAB® programming language Version 6.1, available from Mathworks, of Massachusetts, USA, is used to normalize the locations of targets:

```
function trs3(input_file,output_file);
if nargin < 1
    input_file = 'locs.txt';
%default input file
%2 cols. nominal coordinates and 2 cols. measured coordinates.
    output_file = 'locs.trs';
%default input file
%2 cols. nominal coordinates and
```

```
%2 cols. corrected measured coordinates.
    else if nargin < 2
% beware that input_file has NO file extention !!!
        output_file = [input_file,'.trs'];
        %delta_file = 'delt.trs';
    end;
end
ini_file = 'trs.ini';
fid = fopen(ini_file, 'rt');
while feof(fid) == 0
    row = fgetl(fid);
    param = 'Shear_angle';
    param = [param,' = '];
    if strncmp(row,param,length(param)) == 1
            [Shear_angle, row] = strtok(row);
            [Shear_angle, row] = strtok(row);
            [Shear angle, row] = strtok(row);
            Shear_angle = str2num(Shear_angle);
    end
end
fclose(fid);
fid = fopen(input_file, 'rt');
data = [ ];
%%%%%%%%%%%%%%%%%%%%%%%%%%%%%%%%%%%%%%%%%
while feof(fid) == 0
    row = fgetl(fid);
    data = [data; (sscanf(row, '% f'))'];
end
fclose(fid);
%%%%%%%%%%%%%%%%%%%%%%%%%%%%%%%%%%%%%%%%%
referPts1 = data(:,1:2);
locs1 = data(:,3:4);
locs1 = ([[1, tan(Shear_angle/1000)];[0,1]]*locs1')';
tic;
locs2 = eliminateTRS(locs1, referPts1);
recalc_data = [referPts1, locs2]';
toc;
delta = locs2 − referPts1;
delta = [referPts1, delta]';
fid = fopen(output_file,'w');
fprintf(fid,'%12.8f %12.8f %12.8f %12.8f\n',recalc_data);
status = fclose(fid);
%fid = fopen(delta_file,'w');
%fprintf(fid,'%12.8f %12.8f %12.8f %12.8f\n',delta);
%status = fclose(fid);
% ----------------------------------------------------
function [locs2] = eliminateTRS(locs1, referPts1)
% eliminateShRotSc - eliminate Translation, Rotation and Scaling.
%                       Returns locations locs2 best fitted to referPts1
%                       transformated from locs1 by rotation, scaling and
shift
%
%               referPts1 - n × 2 matrix of reference points location (x,y
coordinates)
%                       n = 2 for determinated system, n > 2 for
overdeterminated system
%
%               locs1 - n × 2 matrix of "measured" points location
%               locs2 - n × 2 matrix of transformed points location
%
%
% $Revision: 0.00 $ $Date: 2001/12/23 $
%
% +++ find affine transformation as first approximation for required
transformation ++++
%
% Build martix for overdeterminated liner system:
%%%%%%%%%%%%%%%%%%%%%%%%%%%%%%%%%%%%%%%%%%
x=locs1(:,1);       y=locs1(:,2);
        len=length(locs1);
        D = [ones(len,1) x y ];
% calculate affine transformation (include offsets) matrix:
    affMatrix=D\referPts1;
    locs2FromAffine = D*affMatrix;
    [locs1, locs2FromAffine];
% find the angle of the transformation
    theta = atan2(affMatrix(3), affMatrix(2));
%%%%%%%%%%%%%%%%%%%%%%%%%%%%%%%%%%%%%%%%%%
% offsets:
```

-continued

```
offsetX = affMatrix(1);
offsetY = affMatrix(4);
% Scaling
Sx=1;
Sy=1;
options = optimset;
% definitions for least square sum search
disp('scale teta offsetX, offsetY');
x0 = [Sx, Sy, theta, offsetX, offsetY] % parameters vector for search
start
        options.Display = 'off';
% search for least square sum
% returns vector optParams of the same parameters as defined x0 which
give least square sum
%         sseOrtog - square sum error function defined below in different
file
[optParms, fval, exitflag, output] = ...
    fminsearch('sseOrtog', x0, options, locs1', referPts1');
if (exitflag <= 0)
    warning('Minimization seems to have failed - giving up')
    exitflag
    output
end
% Parameters found from optimization:
%%%%%%%%%%%%%%%%%%%%%%%%%%%%%%%%%%%%%%%%%%%%%%%%
ScalingX = optParms(1)
        ScalingY = optParms(2)
optimTheta = optParms(3)
offsetX = optParms(4)
offsetY = optParms(5)
% Transformation matrix:
transfMatrix = [ offsetX, offsetY; ...
        ScalingX * cos(optimTheta), -ScalingY * sin(optimTheta); ...
        ScalingX * sin(optimTheta), ScalingY * cos(optimTheta)]
locs2 = D * transfMatrix;
The above function calls the following additional function:
function sse = sseOrtog(xformParams, locs, targetLocs)
%
% xformParams is a 1 x 4 vector [s, theta, tx, ty] of the parameters:
%       s is the scale factor
%       theta is rotation angle
%       tx, ty are translations
% locs is a 2 x n matrix of n (x,y) locations before transformation
% targetLocs is a 2 x n matrix of n (x,y) nominal locations
%
%tic;
Sx = xformParams(1);
Sy = xformParams(2);
theta = xformParams(3);
tx = xformParams(4);
ty = xformParams(5);
nlocs = size(locs); nlocs = nlocs(2);
% create transformation matrix
trm = [[Sx*cos(theta), Sy*sin(theta)];[-Sx*sin(theta), Sy*cos(theta)]];
trans = [tx, ty];
trans = trans(ones(nlocs,1),:);
[locs;targetLocs]';
diffs = targetLocs - (trm*locs) - trans';
% size (diffs)
sse = diffs(:)'*diffs(:);
%disp(sse);
%toc;
```

Returning now to FIG. 8, the normalization of target coordinates, for example using the above described functions, is repeated until respective coordinates of targets on a desired quantity of substrates are normalized. In the next operation, the normalized locations of selected targets, typically but not necessarily all targets, are averaged to generate an averaged output 350 which is representative of the respective location of each corresponding target on those substrates which have been measured.

In the subsequent operation of method 310, a non-uniformly modified control file, such as recordation file 346, is generated from the averaged output 350 along with CAM image 40, for example using the methodologies described hereinabove with reference to FIGS. 3-7E. Recordation file 346 is stored in a memory so that it is available for use by system 10 to expose a substrate board. In accordance with an embodiment of the invention, the file 346 is in a compressed or non-compressed raster image form and define a non-uniformly modified version of CAM image 40.

In the imaging mode 330 of method 310, each new substrate board, such as a substrate 12, onto which a portion of an electrical circuit pattern is to be exposed, is placed on system 10. Registration targets on a substrate 12 are located, for example, using sensors 34, and substrate 12 is aligned and registered for subsequent exposure. Substrate 12 is exposed using recordation file 346 such that LDI system 10 records a non-uniformly modified version of CAM image 40, such as is contained in recordation file 346, onto the surface of substrate 12 substantially without deviation therefrom.

Figure 9:
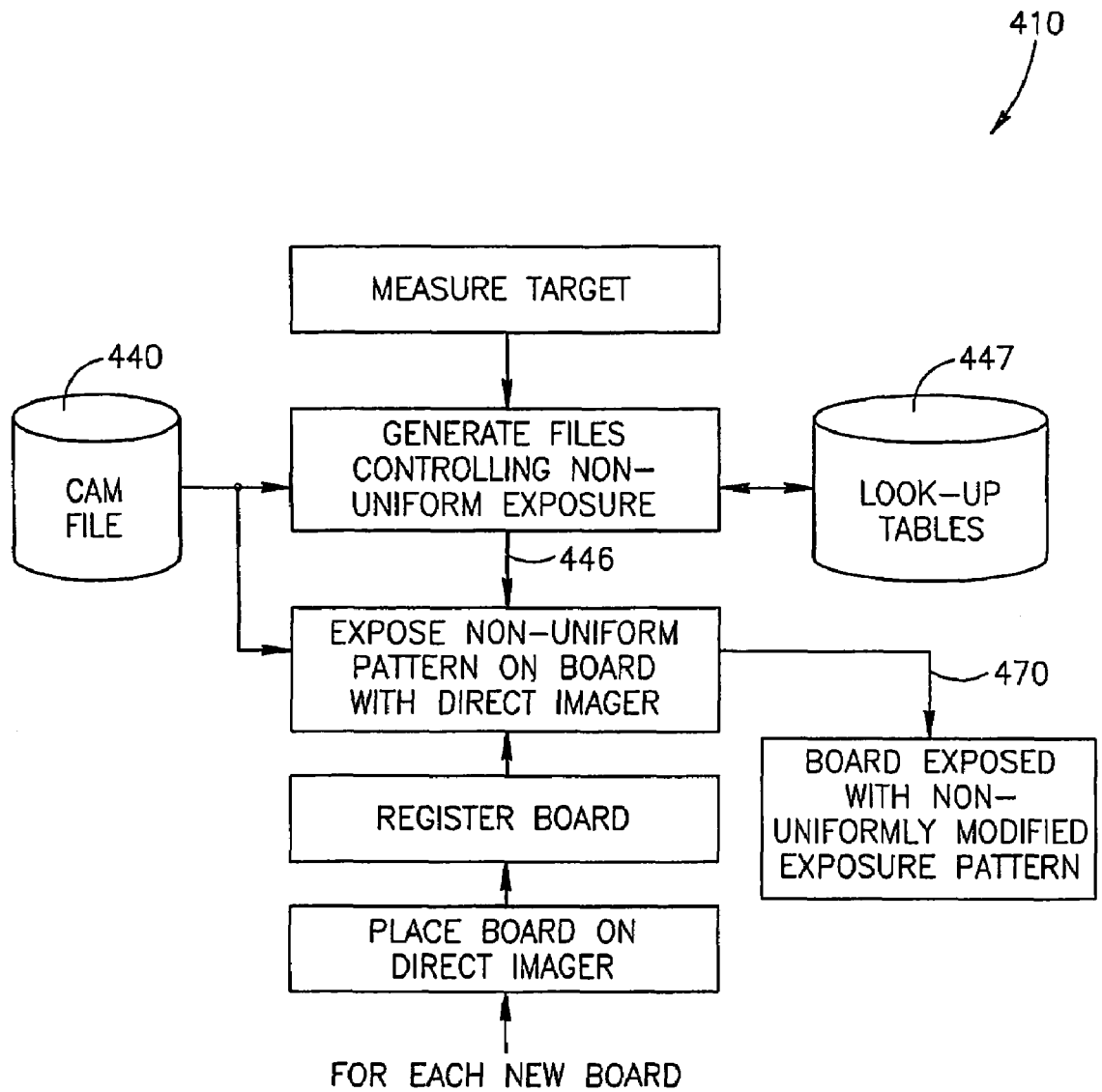
FIG. 9 is a simplified flow diagram of a method for exposing patterns on printed circuit boards in accordance with another embodiment of the invention.

Reference is now made to FIG. 9 which is a simplified flow diagram of a method 410 for exposing patterns on printed circuit boards in accordance with another embodiment of the invention. In accordance with method 410, a control file 446 is generated from the processing of actual measured locations of targets on a substrate 12, respective of anticipated locations as indicated, for example, by a CAM file 440.

Control file 446 differs from recordation file 346 (FIG. 8) inasmuch as control file 446 contains instructions that are operative to cause an LDI system 10 to record, in a non-uniform manner, the image contained in CAM file 440. The image contained in CAM file 440 generally corresponds to a non-modified version of the pattern to be recorded. Method 410 thus avoids the operations of initially generating a non-uniform version of CAM image 40 (FIG. 1), and then transferring the non-uniform version of CAM image to the surface of substrate 12.

As seen in FIG. 9, the generation of a control file 446 is performed using inputs from the measurement of actual locations of targets in a substrate and the anticipated locations of those targets, provided for example by CAM file 440. In accordance with an embodiment of the invention, control file 446 is stored as a look up table 447, which indicates an offset that is selectively applied during the recordation of a recorded image 470 by an LDI system. It is appreciated that inputs from the measurement of targets may be from the measurement of a single target, or from multiple targets such as was described with respect to learn mode 320 in FIG. 8.

In accordance with an embodiment of the invention, in method 410, each new substrate board, such as a substrate 12, onto which a portion of an electrical circuit pattern is to be exposed, is placed on a system 10 (FIG. 1). Registration targets are located on a substrate 12, for example using sensors 34, and substrate 12 is aligned and thereby registered for subsequent exposure. Substrate 12 is exposed using CAM file 440, however during exposure CAM file 440 is non-uniformly modified using information supplied by control file 446.

In accordance with an embodiment of the invention, control file 446 causes data contained in CAM file 440 to be delivered to substrate 12 at a non-uniform rate, while a recording beam is scanned at a generally uniform rate (or vice versa), and/or causes substrate to be displaced at a non-uniform rate during exposure.

Figure 10:
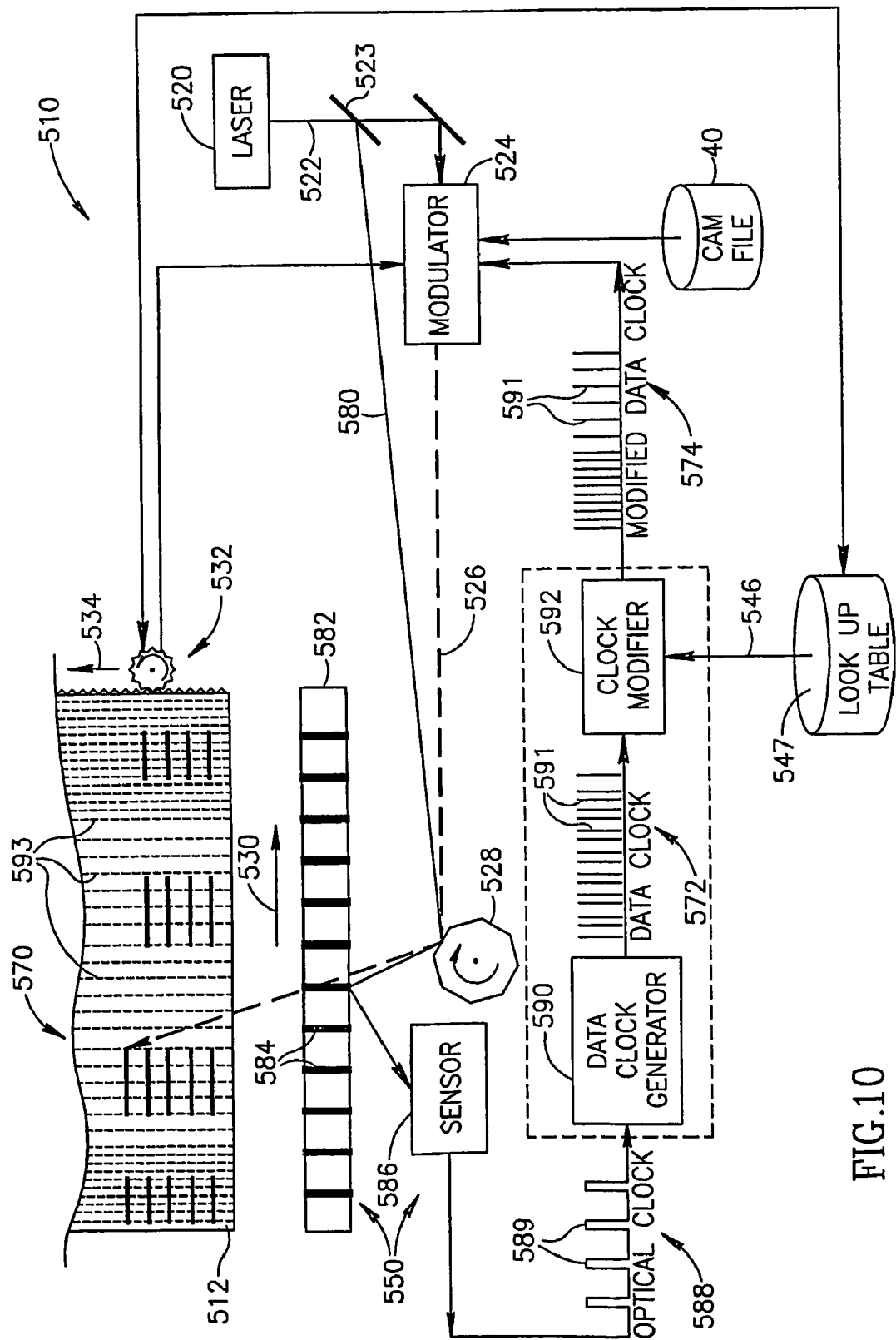
FIG. 10 is a simplified block diagram of a LDI system, employing the method of FIG. 9, for non-uniformly exposing a substrate in accordance with an embodiment of the invention.
Figure 11:
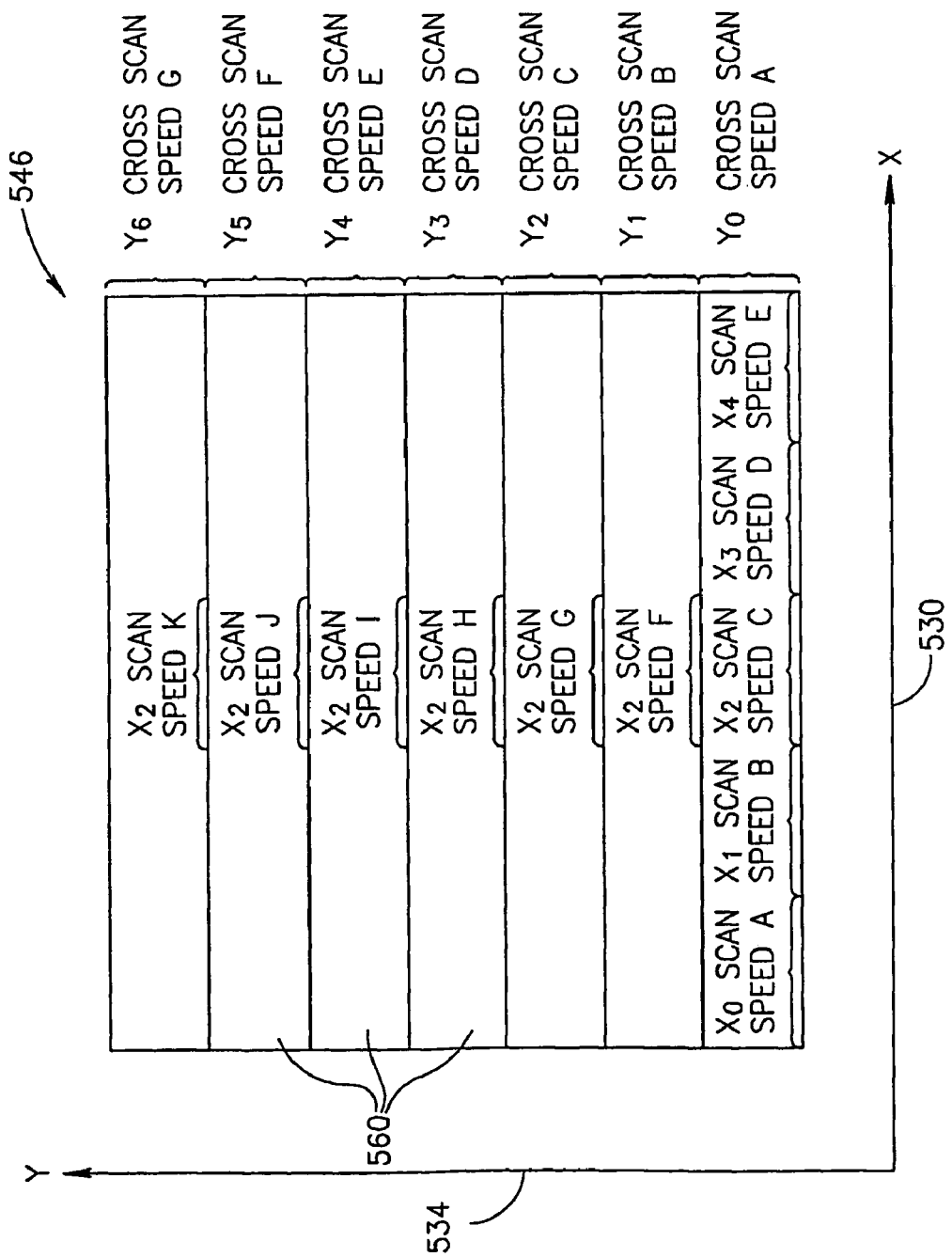
FIG. 11 is a schematic illustration of the structure of a control file 546 employed in the system of FIG. 10.

Reference is now made to FIG. 10 which is a simplified block diagram of a LDI system 510, employing the method of FIG. 9, for non-uniformly exposing a substrate in accordance with an embodiment of the invention, and to FIG. 11 which is a schematic illustration of the structure of a control file 546 employed in the system of FIG. 10.

LDI system 510 generally includes the following parts: a laser 520 generating a laser beam 522; a modulator 524 receiving and modulating laser beam 522 to form one or more data modulated laser beams 526, or a modulated laser beam having independently modulated segments; a scanner such as a rotating polygon 528, or other suitable scanning device, receiving data modulated laser beam 526 and scanning it along a scan axis 530 across the surface of substrate 512; a displacement assembly, generally designated 532 displacing substrate 512 along an axis, the cross scan axis 534, which is generally transverse to scan axis 530, and a beam location determination assembly 550 for determining the generally instantaneous location of modulated laser beam 526 along the scan axis 530. Suitable systems including assemblies for determining the location of a modulated laser beam 526 along the scan axis are described in copending U.S. patent application Ser. Nos. 09/581,377 and 10/038,061, the disclosures of which are incorporated by reference in their entirety for their discussions on this topic.

It is a feature of an embodiment of the present invention that during exposure of recorded image 570, which constitutes a non-uniformly modified version of a pattern to be exposed represented by CAM file 40, substrate 512 is (a) displaced at a non-uniform rate along cross scan axis 534, and/or (b) modulated beam 526 is modulated with data from CAM file 40 in a non-uniform manner as it traverses substrate 512 along scan axis 530.

In accordance with an embodiment of the invention, it is appreciated for example from FIG. 11, the modulation of beam 526 is dependent both on the location of modulated beam 526 along the scan axis 530, and the location of substrate 512 along the cross scan axis 534. This is because different offsets in a pattern to be recorded may be applied during subsequent passes, or swaths 560, of modulated beam 526 across the surface of substrate 512. Thus, a first offset, resulting from a first scan speed, may be applied to a first swath 560 (FIG. 11), or portion of a swath, while a different offset is provided in a subsequent swath, or portion thereof.

Displacement of substrate 512 at a non-uniform rate along cross scan axis 534 is now described. As seen in FIG. 10, displacement assembly 532 is in bilateral communication with look-up table 547. The displacement assembly 532 provides an indication of the location, along the cross scan axis 534, such as by means of an encoder, at which modulated beam 526 is recording a portion of the pattern defined by CAM file 40. For a given cross scan location, for example at a swath 560 in FIG. 11, look-up table 547 supplies a suitable instruction causing displacement assembly to displace substrate 512 at a given rate of displacement, along the cross scan axis.

In accordance with an embodiment of the invention, the rate of displacement of substrate 512 in each swath 560 is independently controllable, subject to mechanical limits, such as acceleration and inertia, inherently associated with the operation of displacement assembly 532. Thus, in a given swath 560 the cross scan speed at which substrate 512 is displaced, relative to modulated beam 526, may be generally the same as, or different from, the cross scan speed at which substrate 512 is displaced in another swath 560.

The non-uniform modulation of modulated beam 526 in the scan direction will now be described. In accordance with an embodiment of the invention, for example as seen in FIG. 10, modulation of modulated beam 526, as it traverses the surface of substrate 12 in the scan direction, is controlled by a data clock. The recording of data contained in CAM file 40 is synchronized by the data clock so that data represented at a given location in CAM file 40 is recorded at the appropriate corresponding location in recorded image 570 on the surface of substrate 512.

It is a feature of an embodiment of the present invention that the data clock is modified, for example by control file 546, so as to record data contained in CAM File 40 in a given non-uniform manner along scan axis 530. Non-uniform recordation of data contained in CAM file 40 along scan axis 530 is operative to provide a desired offset in the scan axis. As seen in FIG. 11, control file 546 causes an image contained in a CAM file 40 to be scanned at a different speed at each of various segments along scan axis 530 in a swath 560. In successive swaths, a different control file may cause a corresponding successive portion of the image to be scanned at a different, and separately controllable, speed. It is noted that the scan speed controls the pixel width in a recorded image, and consequently the respective offset of various portions of recorded image 570.

In accordance with an embodiment of the invention, a test beam 580, is split off from beam 522 by a beam splitter 523. The test beam 580 is scanned such so as to impinge on a ruler 582 at locations that generally correspond to locations along scan axis 530 whereat modulated beam 526 impinges on the surface of substrate 512. As seen in FIG. 10, ruler 582 includes a plurality of markings 584. Markings 584 may be reflective or diffractive in nature. A sensor 586 receives test beam 580 after interaction with ruler 582 and outputs a signal, comprising peaks 589 generally corresponding to markings 584, defining a relatively low resolution optical clock 588.

Optical clock 588 is supplied to a data clock generator 590 which generates a relatively high resolution data clock 572 defined by a plurality of beats 591 for each peak 589 in optical clock 588. Beats 591 defining data clock 572 are synchronized to the optical clock 588 using suitable circuitry, such as a phase locked loop.

Data Clock 572 is supplied to a clock modifier 592 along with control file 546. Clock modifier 592 is operative to modify clock 572, for example by modifying the distance between beats 591 in data clock 572, and to output a modified data clock 574. The modified data clock 574 is supplied to modulator 524 along with CAM file 40 and an indication of the location of substrate 512 along the scan axis. Modulator 524 modulates modulated beam 526 based on image data provided by CAM file 40, wherein synchronization between the image data and the location of modulated beam 526 is provided by displacement assembly 532 and the modified data clock 574.

It is noted that the functionality of data clock generator 590 and clock modifier 592 may be merged in the same circuitry, without clear differentiation between the initial clock generation and subsequent clock modification. Moreover, in place of modifying the distance between beats 591, a clock circuit may be operative to insert variable quantities of beats 591 between peaks of optical clock 589, the result of which is to effectively produce beats 591 at controllable distances. Various functional and operational details of suitable clock generating circuitry for driving modulator 524, suitable for use in an embodiment of the invention, are described in copending U.S. patent application Ser. No. 09/581,377, which is incorporated by reference for its teachings on such circuitry.

It is noted that in U.S. application Ser. No. 09/581,377, phase locked loop circuitry is employed to accommodate acceleration and deceleration of a modulated beam as it scans across a flat field, by inserting a given quantity of beats, according to a look up table, as a function of the location of the modulated beam along a scan axis. In accordance with an embodiment of the present invention, the concept of employing a look up table is expanded to a two dimensional model in which portions of a pattern to be recorded in a swath are selectively offset, and different offsets are applied to subsequent swaths.

As a consequence of generating the modified data clock 574, the width of pixels in recorded image 570, relative to corresponding pixels defining an image represented by CAM file 40, is non-uniform along scan axis 530. In FIG. 10 this is seen by different distances between pixel delineation markers 593. Such non-uniformity is applied during the recording of recorded image 570 to offset the location of some parts of recorded image 570.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A method for fabricating an electrical circuit, comprising:
    sensing an actual location of each of a plurality of alignment targets that are distributed on a plurality of electrical circuit substrates, thus detecting unintentional distortions;
    providing image data of an electrical circuit pattern to be recorded on said substrates;
    non-uniformly modifying said image data based on an average of the actual locations of the plurality of alignment targets, thus creating modified image data; and
    recording said electrical circuit pattern on said electrical circuit substrates according to said modified image data, such that recorded features of the electrical circuit pattern are distorted in accordance with the unintentional distortions.

2. An electrical circuit fabricated according to the method of claim 1.

3. An electrical circuit fabricating system operating according to the method of claim 1.

4. A circuit fabrication method, comprising:
    detecting unintentional distortions based on a difference between actual and planned locations of a plurality of alignment targets on a plurality of electrical circuit substrates;
    modifying a planned version of a circuit pattern, based on the difference between an average of the actual locations and the planned locations of the alignment targets, so as to provide a non-uniformly modified version of the circuit pattern; and
    fabricating the circuit pattern according to the modified version of the circuit pattern, such that fabricated features of the circuit pattern are distorted in accordance with the unintentional distortions.

5. The circuit fabrication method as set forth in claim 4, wherein the alignment targets include vias.

6. The circuit fabrication method as set forth in claim 4, wherein the modified version is produced by globally modifying the planned version in a non-uniform transform.

7. The circuit fabrication method as set forth in claim 4, wherein the circuit pattern comprises a plurality of sectors, and the modified version is produced by modifying the planned version on a sector by sector basis.

8. The circuit fabrication method as set forth in claim 4, wherein:
    a plurality of circuit boards are fabricated according to the modified version.

9. The circuit fabrication method as set forth in claim 4, wherein:
    the modified version is generated as a control file, and a look up table is prepared based on the control file; and
    the look up table is used in the fabrication of the circuit pattern to adjust exposure conditions.

10. An electrical circuit fabricated according to the method of claim 4.

11. An electrical circuit fabricating system operating according to the method of claim 4.

12. A circuit fabrication method, comprising:
    creating a look up table based on a difference between locations of a plurality of targets on a plurality of actually-recorded versions and on a planned version of a circuit pattern, the actually-recorded versions including unintentional distortions;

determining averages of the locations of the plurality of targets on the plurality of actually-recorded versions;

using the look up table to modify conditions for scanning; and scanning a substrate and fabricating an electrical circuit to be scanned according to the modified conditions, such that alignment targets of the electrical circuit to be scanned are scanned onto locations corresponding to the average locations of the alignment targets on the actually-recorded versions of the circuit pattern.

13. The circuit fabrication method as set forth in claim 12, wherein the conditions for scanning in the scanning direction are modified by:

inputting a clock signal;

modifying the clock signal according to the look up table to produce a modified clock signal; and modulating a planned version of the circuit pattern to be scanned according to the modified clock signal to produce a data signal;

wherein the scanning the substrate and fabricating the electrical circuit to be scanned comprises scanning using the data signal clocked using the modified clock signal.

14. The circuit fabrication method as set forth in claim 12, wherein scanning a substrate and fabricating the electrical circuit to be scanned according to the modified conditions comprises moving the substrate in the cross scanning direction at a rate based on the contents of the look up table.

15. An electrical circuit fabricated according to the method of claim 12.

16. An electrical circuit fabricating system operating according to the method of claim 12.

17. A method for fabricating an electrical circuit, comprising:

sensing actual locations of a plurality of alignment targets that are distributed on a plurality of recorded electrical circuit substrates;

providing image data of an electrical circuit pattern to be recorded on a substrate;

non-uniformly modifying said image data based on an average of the actual locations of the plurality of alignment targets, thus creating modified image data; and recording said electrical circuit on said substrate according to said modified image data, such that recorded features of the electrical circuit are distorted in accordance with the actual locations of the plurality of alignment targets.

* * * * *